(12) United States Patent
Huang et al.

(10) Patent No.: US 11,942,372 B2
(45) Date of Patent: Mar. 26, 2024

(54) DIELECTRIC PROTECTION LAYER IN MIDDLE-OF-LINE INTERCONNECT STRUCTURE MANUFACTURING METHOD

(71) Applicant: Taiwan Semiconductor Manufacturing Company, Ltd., Hsinchu (TW)

(72) Inventors: Kuan-Da Huang, Hsinchu County (TW); Hao-Heng Liu, Hsinchu (TW); Li-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 176 days.

(21) Appl. No.: 17/459,065

(22) Filed: Aug. 27, 2021

(65) Prior Publication Data
US 2023/0061082 A1  Mar. 2, 2023

(51) Int. Cl.
*H01L 21/8234* (2006.01)
*H01L 27/02* (2006.01)
*H01L 27/088* (2006.01)

(52) U.S. Cl.
CPC ........... *H01L 21/823475* (2013.01); *H01L 21/823437* (2013.01); *H01L 21/823462* (2013.01); *H01L 27/0207* (2013.01); *H01L 27/088* (2013.01)

(58) Field of Classification Search
CPC ..... H01L 21/823437; H01L 21/823462; H01L 21/823475

USPC ......................................................... 438/199
See application file for complete search history.

(56) References Cited

U.S. PATENT DOCUMENTS

2019/0378722 A1* 12/2019 Economikos ......... H01L 29/785

OTHER PUBLICATIONS

Xiao, Hong. "Introduction to Semiconductor Manufacturing Technology Second Edition" SPIE Press, pp. 567-577, published in 2012.

* cited by examiner

*Primary Examiner* — Hoai V Pham
(74) *Attorney, Agent, or Firm* — Eschweiler & Potashnik, LLC

(57) ABSTRACT

In some embodiments, the present disclosure relates to a method for manufacturing an integrated chip. The method includes forming a transistor structure over a substrate. The transistor structure comprises a pair of source/drain regions and a gate electrode between the source/drain regions. A lower inter-level dielectric (ILD) layer is formed over the pair of source/drain regions and around the gate electrode. A gate capping layer is formed over the gate electrode. A selective etch and deposition process is performed to form a dielectric protection layer on the gate capping layer while forming a contact opening within the lower ILD layer. A lower source/drain contact is formed within the contact opening.

20 Claims, 14 Drawing Sheets

DIELECTRIC PROTECTION LAYER IN MIDDLE-OF-LINE INTERCONNECT STRUCTURE MANUFACTURING METHOD

BACKGROUND

In the manufacturing of integrated circuits (ICs), devices are formed on a wafer and connected by conductive interconnect layers. These conductive interconnect layers can be formed during so-called middle-of-the-line (MOL) processes or back-end-of-line (BEOL) processes. MOL and BEOL processes are similar in that they both form openings in a dielectric layer (e.g. contact holes, trenches, or via holes in a dielectric layer), and then fill these openings with a conductive material. MOL differs from BEOL in that the MOL typically occurs earlier in the fabrication process, and may refer to the process of forming contacts directly on or close to device structures such as a gate electrode or a source/drain region; whereas BEOL typically occurs later in the fabrication process, and may refer to the process of forming successive metallization layers and vias above the contacts formed by MOL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
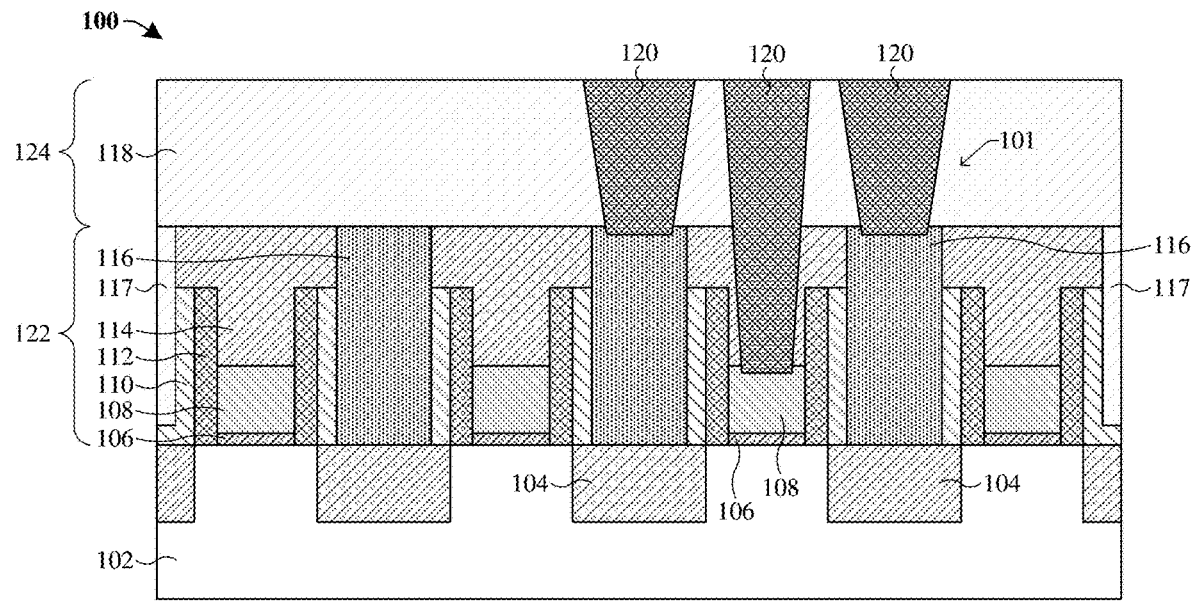
FIG. 1 illustrates a cross-sectional view of some embodiments of an integrated chip having a gate capping layer over a gate electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors) disposed over and/or within a substrate. A middle-of-the-line (MOL) interconnect structure may be disposed over the substrate. The MOL interconnect structure includes conductive contacts, interconnect vias, and metal lines that play a significant role in semiconductor device and circuit performance. The integrated chip comprises a transistor structure disposed over a substrate and including a pair of source/drain regions disposed on the substrate and a gate electrode between the pair of source/drain regions. A lower inter-level dielectric (ILD) layer is disposed over the pair of source/drain regions and surrounding the gate electrode. The gate electrode may be recessed from a top surface of the lower ILD layer. Further, a gate capping layer may be disposed on the gate electrode. By recessing the gate electrode and implementing the gate capping layer, the gate electrode is isolated and protected from neighboring conductive features, and thus leakage issues can be reduced or eliminated. In addition, the MOL interconnect structure comprises conductive contacts overlying the pair of source/drain regions and disposed on opposing sides of the gate electrode. As scaling of device features continues, distance between various conductive contacts and interconnect features shrink, and current leakage with parasitic capacitance become key limiting factors for device performance. It is desired to reduce or prevent current leakage among contacts and other conductive features while at the same time limiting resistance and capacitance increase.

One challenge with the above integrated chip is fabrication of the conductive contacts without degrading device performance and/or endurance. For example, during fabrication of the MOL interconnect structure an etching process is performed on the lower ILD layer to form conductive contact openings within the lower ILD layer and expose and upper surface of the source/drain regions. A conductive material is formed over the source/drain regions and within the conductive contact openings. Further, a planarization process is performed on the conductive material until an upper surface of the gate capping layer is reached, thereby forming a plurality of lower source/drain contacts. However, the etching process may include exposing the lower ILD layer and the gate capping layer to one or more fluorine-based etchants. The one or more fluorine-based etchants may remove portions of the gate capping layer, thereby reducing a thickness of the gate capping layer and/or rounding the corners of the gate capping layer. This may result in the formation of volatile by-products (e.g., silicon tetrafluoride) on the gate capping layer and/or may degrade interfaces between the gate capping layer, thereby reducing a structural integrity and/or an endurance of the integrated chip. In addition, the rounded corners of the gate capping layer may result in a reduced distance between adjacent contacts, thereby increasing parasitic capacitance and/or leakage current within the MOL interconnect structure. This, in part, may degrade a performance of the integrated chip.

Accordingly, the present disclosure relates to an integrated chip with an improved MOL interconnect structure and associated manufacturing methods to improve parasitic capacitance and increase structural integrity. As a result, device reliability and performance are improved. The integrated chip comprises a transistor structure disposed over a substrate and including a pair of source/drain regions disposed on the substrate and a gate electrode between the source/drain regions. A lower inter-level dielectric (ILD) layer is disposed over the pair of source/drain regions and surrounding the gate electrode. A gate capping layer is disposed on the gate electrode. Further, source/drain contacts are disposed over the pair of source/drain regions and on opposing sidewalls of the gate electrode. During fabrication of the source/drain contacts, a selective etch and deposition process may be performed on the lower ILD layer and the gate capping layer to form contact openings within the lower ILD layer an over the source/drain regions. The selective etch and deposition process is configured to selectively form a dielectric protection layer along an upper surface of the gate capping layer while concurrently selectively etching the lower ILD layer and defining the contact openings. Then, the conductive contacts are formed within the contact openings. The dielectric protection layer is configured to protect the gate capping layer while etching the lower ILD layer and forming the contact openings, such that the formation of volatile by-products, reduction of a thickness of the gate capping layer, and rounding of corners of the gate capping layer may be mitigated and/or prevented. This reduces parasitic capacitance between adjacent contacts and reduces damage to the gate capping layer, thereby increasing a performance and structural integrity of the integrated chip.

FIG. 1 illustrates a cross-sectional view of some embodiments of an integrated chip 100 having a gate capping layer 114 overlying a gate electrode 108.

In some embodiments, the integrated chip 100 includes a transistor structure 101 disposed on/within a substrate 102. In various embodiments, the substrate 102 may, for example, be or comprise bulk silicon, any type of semiconductor body (e.g., silicon, SiGe, etc.), a silicon-on-insulator (SOI) substrate, another suitable substrate material, and/or one or more die on a wafer, as well as any other type of semiconductor layers, epitaxial layers, or dielectric layers associated therewith. The transistor structure 101 can be a logic device that includes the gate electrode 108 separated from the substrate 102 by a gate dielectric layer 106. A pair of source/drain regions 104 is disposed within and/or on the substrate 102 on opposite sides of the gate electrode 108. The transistor structure 101 can be a single-gate planar transistor device as well as a multi-gate transistor device, such as a fin field-effect transistor (FinFET). Further, the transistor structure 101 can also be other devices such as gate-all-around (GAA) devices, omega-gate devices, partially-depleted SOI (PD-SOI) devices, fully-depleted SOI (FD-SOI) devices, or other applicable devices.

In various embodiments, conductive contacts are respectively coupled to the gate electrode 108, the source/drain regions 104, body contact regions (not shown), or other regions of the transistor structure 101. In various embodiments, the conductive contacts are part of a middle-of-the-line (MOL) structure overlying the substrate 102 and may comprise a plurality of upper conductive contacts 120 and a plurality of lower source/drain contacts 116. In some embodiments, each conductive contact may comprise a lower contact structure 122 surrounded by a lower inter-level dielectric (ILD) layer 117 and/or an upper contact structure 124 surrounded by an upper ILD layer 118. The upper contact structure 124 overlies the lower contact structure 122. For example, at least a portion of the upper conductive contacts 120 may be part of the upper contact structure 124 and the lower source/drain contacts 116 may be part of the lower contact structure 122. In various embodiments, the upper conductive contacts 120 and the lower source/drain contacts 116 may, for example, be or comprise tungsten, copper, aluminum, ruthenium, titanium, tantalum, titanium nitride, tantalum nitride, another conductive material, or any combination of the foregoing. Further, a lower etch stop layer 110 may be disposed along and lining sidewalls of the lower ILD layer 117.

In various embodiments, a sidewall spacer 112 is disposed alongside the gate electrode 108. The sidewall spacer 112 extends along opposing sidewalls of the gate electrode 108 and opposing sidewalls of the gate dielectric layer 106. Further, the sidewall spacer 112 is disposed along the lower etch stop layer 110. In some embodiments, a top surface of the sidewall spacer 112 is disposed above a top surface of the gate electrode 108. Further, the top surface of the sidewall spacer 112 may be aligned or coplanar with a top surface of the lower etch stop layer 110. In further embodiments, the lower etch stop layer 110 may, for example, be or comprise silicon nitride, a low-k dielectric material, silicon, silicon carbon nitride, another suitable dielectric material, or any combination of the foregoing. In yet further embodiments, the sidewall spacer 112 may, for example, be or comprise silicon nitride, silicon carbide, silicon oxynitride, silicon oxycarbide, another suitable material, or any combination of the foregoing.

In various embodiments, the gate electrode 108 is recessed from a top surface of the lower ILD layer 117. A gate capping layer 114 is disposed on the gate electrode 108. A top surface of the gate capping layer 114 may be aligned or coplanar with the top surface of the lower ILD layer 117. In further embodiments, the gate capping layer 114 may comprise a non-oxide dielectric material. For example, the gate capping layer 114 may be or comprise silicon, silicon nitride, silicon carbon nitride, a non-oxide dielectric material, another suitable dielectric material, or any combination of the foregoing. In yet further embodiments, the lower etch stop layer 110 and the gate capping layer 114 may comprise a same material (e.g., silicon nitride, silicon, silicon carbon nitride, or the like). The gate capping layer 114 continuously extends from the top surface of the lower etch stop layer 110 and the top surface of the sidewall spacer 112, along a sidewall of the sidewall spacer 112, to the top surface of the gate electrode 108. In further embodiments, the gate capping layer 114 is T-shaped, such that a lower portion of the gate capping layer 114 is surrounded by the sidewall spacer 112 and an upper portion of the gate capping layer 114 directly overlies the lower etch stop layer 110 and the sidewall spacer 112.

In some embodiments, the lower contact structure 122 comprises the plurality of lower source/drain contacts 116 that overlie each source/drain region 104. In various embodiments, the lower source/drain contacts 116 each fill a slot between and directly contacts sidewalls of the lower etch stop layer 110 and the gate capping layer 114. In yet further embodiments, top surfaces of the lower source/drain contacts 116 may be aligned or coplanar with the top surface of the gate capping layer 114 and/or the top surface of the lower ILD layer 117. In further embodiments, the plurality of upper conductive contacts 120 directly overlie and are electrically coupled to the lower source/drain contacts 116 and the gate electrode 108 of the transistor structure 101. The upper conductive contact 120 directly overlying the gate electrode 108 of the transistor structure 101 continuously extends through the upper ILD layer 118 and the gate capping layer 114 to contact the gate electrode 108.

In various embodiments, during fabrication of the lower contact structure 122 a selective etch and deposition process is performed on the lower ILD layer 117 and the gate capping layer 114 to form openings within the lower ILD layer 117 directly over corresponding source/drain regions 104. The selective etch and deposition process is configured to selectively form a dielectric protection layer (not shown) along the top surface of the gate capping layer 114 while concurrently selectively etching the lower ILD layer 117. Subsequently, the lower source/drain contacts 116 are formed within the openings such that top surfaces of the lower source/drain contacts 116 are aligned or coplanar with the top surface of the gate capping layer 114. By forming the dielectric protection layer along the top surface of the gate capping layer 114 while concurrently etching the lower ILD layer 117, damage to the gate capping layer 114 may be mitigated or prevented. For example, formation of volatile by-products from etchants used during the selective etch and deposition process along the top surface of the gate capping layer 114 is mitigated or prevented, thereby increasing a structural integrity and endurance of the integrated chip 100. Further, the dielectric protection layer prevents rounding of the corners of the gate capping layer 114, such that upper opposing sidewalls of the gate capping layer 114 meet the top surface of gate capping layer 114 at a right angle. This, in part, facilitates the lower source/drain contacts 116 each having a rectangular shape, thereby increasing a distance between adjacent lower source/drain contacts 116 and decreasing a parasitic capacitance within the lower and upper contact structures 122, 124. Furthermore, by preventing damage to the gate capping layer 114 while forming the lower source/drain contacts 116, an ability for the gate capping layer 114 to mitigate or prevent damage to the gate electrode 108 during subsequent fabrication steps and/or operation of the integrated chip 100 is increased. Thus, the selective etch and deposition process increases a performance and structural integrity of the integrated chip 100.

Figure 2A:
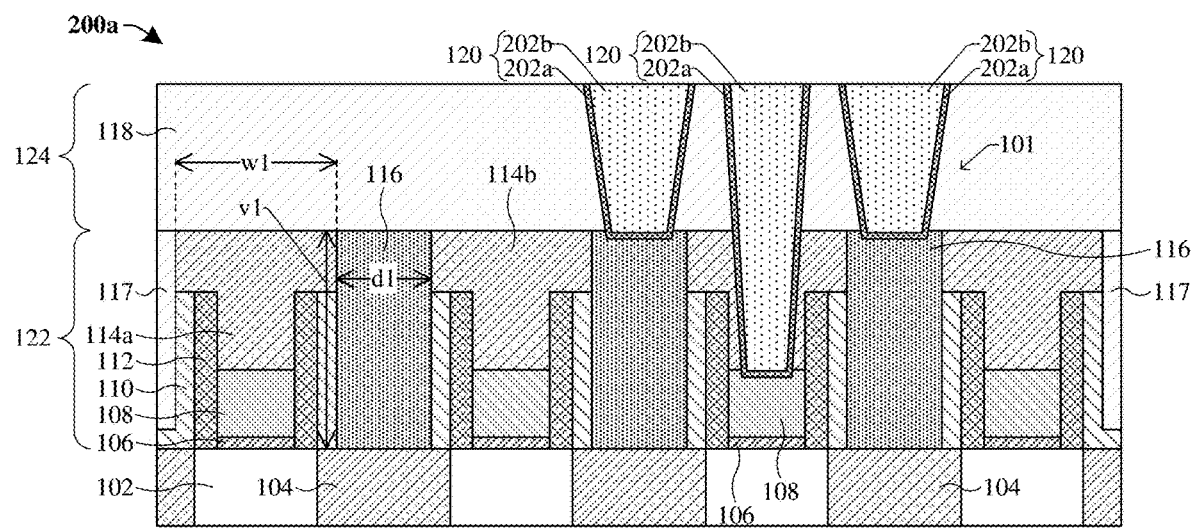
FIGS. 2A-2C and 3A-3B illustrate various cross-sectional views of some additional embodiments of an integrated chip having a gate capping layer over a gate electrode.

FIG. 2A illustrates a cross-sectional view of some embodiments of an integrated chip 200a corresponding to some alternative embodiments of the integrated chip 100 of FIG. 1, in which the upper conductive contacts 120 comprise a liner layer 202a and a conductive body 202b. The liner layer 202a laterally surrounds the conductive body 202b and extends along a lower surface of the conductive body 202b. In various embodiments, the liner layer 202a may comprise or be configured as a diffusion barrier layer or an adhesive layer. Further, the liner layer 202a may, for example, be or comprise titanium, tantalum, titanium nitride, tantalum nitride, another conductive material, or any combination of the foregoing. The conductive body 202b may, for example, be or comprise aluminum, copper, ruthenium, tungsten, another conductive material, or any combination of the foregoing.

In some embodiments, the gate capping layer 114 comprises a first gate capping structure 114a laterally adjacent to a second gate capping structure 114b, where the first and second gate capping structures 114a, 114b directly overlie a corresponding gate electrode 108. In various embodiments, a width w1 of the first gate capping structure 114a is about 45 nanometers (nm), within a range of about 30 to 60 nm, or another suitable value. In various embodiments, widths of each gate capping structure directly overlying a corresponding gate electrode 108 are equal to one another and may respectively be about 45 nm, within a range of about 30 to 60 nm, or another suitable value. In some embodiments, a vertical distance v1 between a top surface of the source/drain regions 104 and a top surface of the gate capping layer 114 is about 120 nm, within a range of about 80 to 160 nm, or another suitable value. In further embodiments, a lateral distance d1 between adjacent gate capping structures of the gate capping layer 114 is about 15 nm, within a range of about 10 to 20 nm, or another suitable value. In some embodiments, the lateral distance d1 may correspond to a width of a corresponding lower source/drain contact 116 disposed between the adjacent gate capping structures of the gate capping layer 114. For example, the lateral distance d1 may be equal to the width of the lower source/drain contact 116 disposed between the first gate capping structure 114a and the second gate capping structure 114b.

Figure 2B:
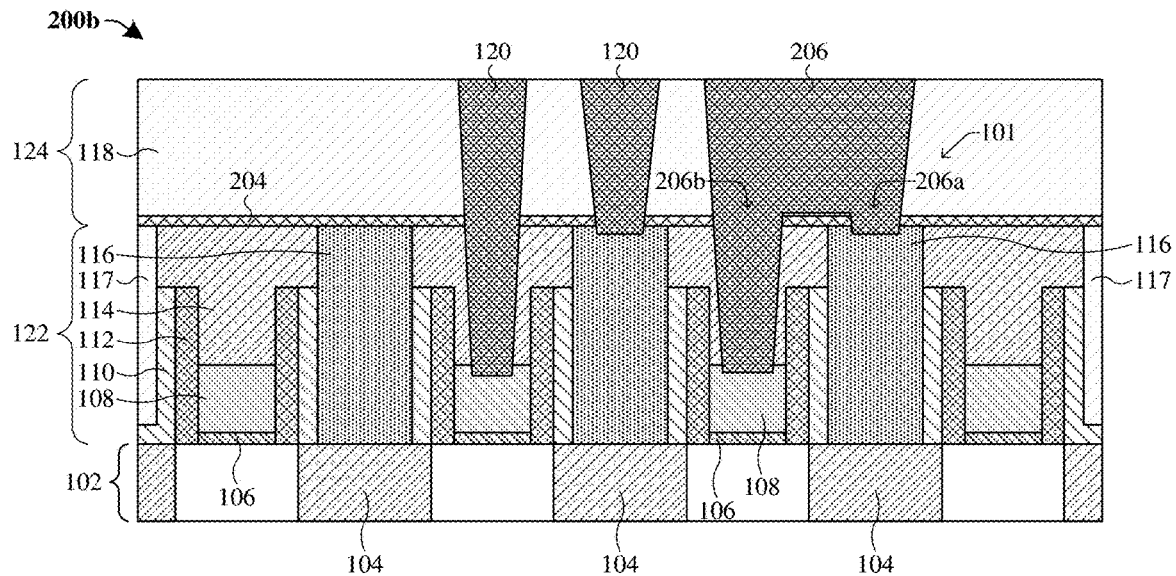

FIG. 2B illustrates a cross-sectional view of some embodiments of an integrated chip 200b corresponding to some alternative embodiments of the integrated chip 100 of FIG. 1, in which an upper etch stop layer 204 is disposed between the lower ILD layer 117 and the upper ILD layer 118. The upper etch stop layer 204 may, for example, be or comprise silicon nitride, silicon carbide, silicon carbon nitride, another suitable dielectric material, or any combination of the foregoing. In some embodiments, the upper etch stop layer 204 may comprise a same material as the lower etch stop layer 110 and/or may comprise a same material as the gate capping layer 114. Further, the plurality of upper conductive contacts 120 may comprise a body contact 206. The body contact 206 comprises a first portion 206a electrically coupled to one of the source/drain regions 104 via a corresponding lower source/drain contact 116 and a second portion 206b electrically coupled to the gate electrode 108. Thus, the body contact 206 is configured to directly electrically couple the gate electrode 108 to an adjacent source/drain region 104.

Figure 2C:
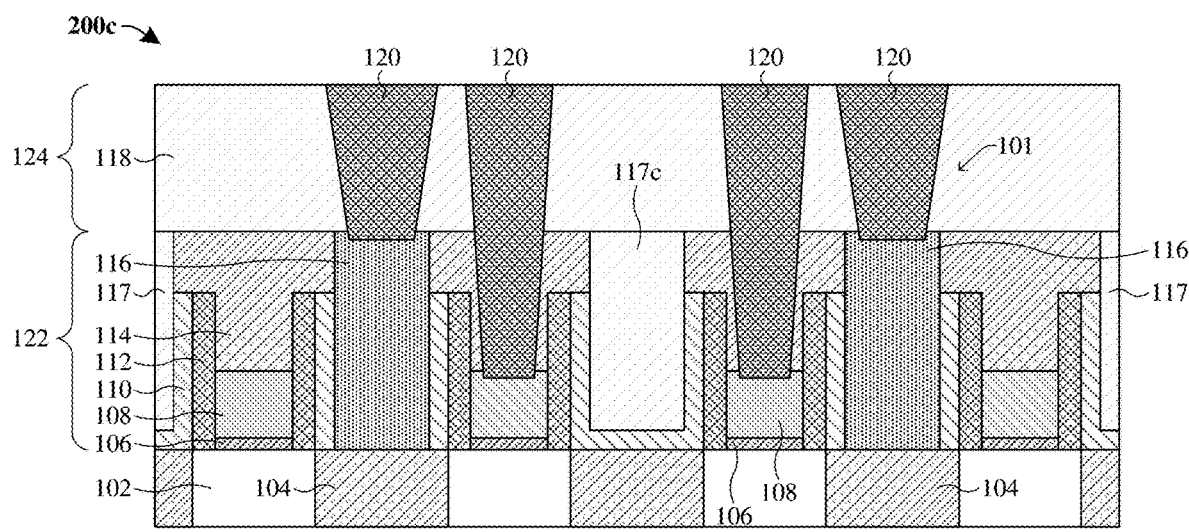

FIG. 2C illustrates a cross-sectional view of some embodiments of an integrated chip 200c corresponding to some alternative embodiments of the integrated chip 100 of FIG. 1, in which a center segment 117c of the lower ILD layer 117 is disposed directly between adjacent gate capping structures of the gate capping layer 114.

Figure 3A:
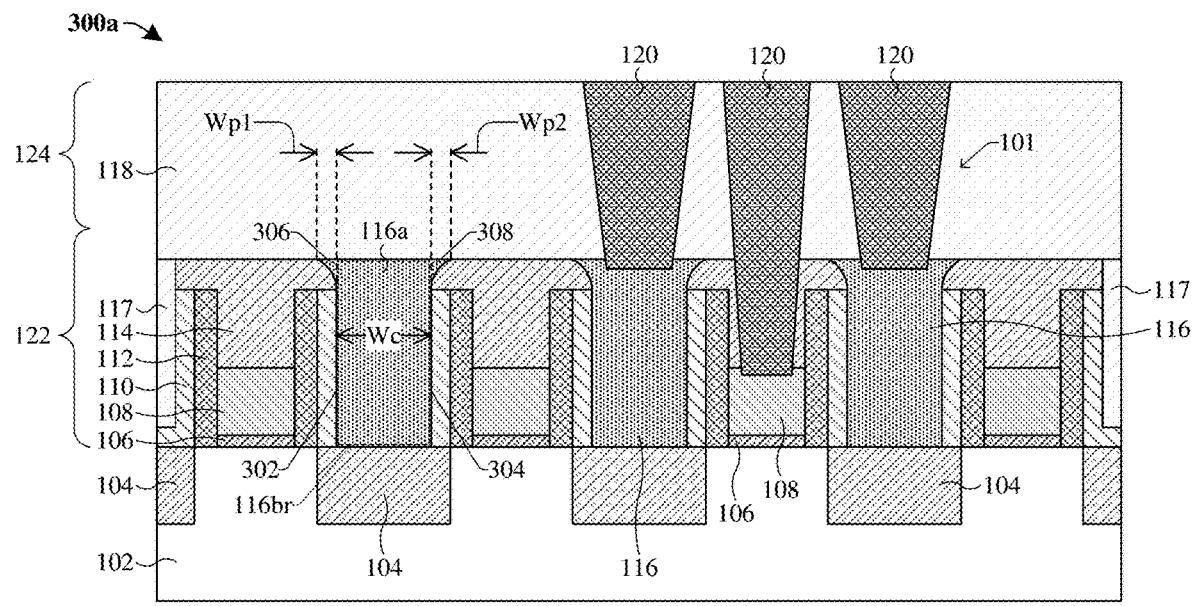

FIG. 3A illustrates a cross-sectional view of some embodiments of an integrated chip 300a corresponding to some alternative embodiments of the integrated chip 100 of FIG. 1, in which each lower source/drain contact 116 comprises one or more protrusions that conform to an adjacent rounded corner of the gate capping layer 114. The one or more protrusions of the lower source/drain contacts 116 directly overlie at least a portion of the gate capping layer 114.

In various embodiments, the plurality of lower source/drain contacts 116 includes a first lower source/drain contact 116a. The first lower source/drain contact 116a has a first straight sidewall 302 and a second straight sidewall 304 opposite the first straight sidewall 302. In various embodiments, the first and second straight sidewalls 302, 304 are substantially straight and/or are each perpendicular relative to a top surface of the substrate 102. In some embodiments, the first lower source/drain contact 116a comprises a body region 116*br* and one or more protrusions 306, 308 that extend from the body region 116*br* to an adjacent rounded corner of the gate capping layer 114. The body region 116*br* is defined between the first straight sidewall 302 and the second straight sidewall 304, such that a width Wc of the body region 116*br* is defined between the first and second straight sidewalls 302, 304. In various embodiments, the width Wc is about 15 nanometers (nm), within a range of about 10 to 20 nm, or another suitable value. In yet further embodiments, the first lower source/drain contact 116*a* comprises a first protrusion 306 that extends from the body region 116*br* in a first direction and a second protrusion 308 that extends from the body region 116*br* in a second direction that is opposite the first direction. A first width Wp1 of the first protrusion 306 is defined from the body region 116*br* to an outermost point of the first protrusion 306, and a second width Wp2 of the second protrusion 308 is defined from the body region 116*br* to an outermost point of the second protrusion 308. In various embodiments, the first and second widths Wp1, Wp2 are respectively about 0.75 nm, within a range of about 0.5 to 1 nm, less than about 1 nm, or another suitable value.

In addition, in some embodiments, a ratio between the first width Wp1 and the width Wc (e.g., Wp1:Wc) is, for example, about 1:20, within a range of about 0.25:20 to 1:20, or another suitable value. In further embodiments, a ratio between the second width Wp2 and the width Wc (e.g., Wp2:Wc) is, for example, about 1:20, within a range of about 0.25:20 to 1:20, or another suitable value. In various embodiments, if the ratios between the first and second width Wp1, Wp2 and the width Wc (e.g., Wp1:Wc and Wp2:Wc) are relatively low (e.g., less than about 1:20), then a distance between the lower source/drain contacts 116 and laterally adjacent upper conductive contacts 120 is increased. This, in part, reduces parasitic capacitance within the lower and upper contact structures 122, 124, thereby increasing a performance of the integrated chip 300*a*. Thus, in some embodiments, the width Wc of the body region 116*br* is about 20, 30, 40, or within a range of about 20 to 60 times greater than the first and second widths Wp1, Wp2. In yet further embodiments, if the ratios between the first and second width Wp1, Wp2 and the width Wc are relatively high (e.g., greater than about 1:20), then a distance between the lower source/drain contacts 116 and laterally adjacent upper contacts 120 is decreased. This may increase parasitic capacitance within the lower and upper contact structures 122, 124, thereby degrading a performance of the integrated chip 300*a*. It will be appreciated that the aforementioned ratios described with reference to the integrated chip 300*a* of FIG. 3A are also applicable to the structures of FIGS. 3B, 17, and 22B.

Figure 3B:
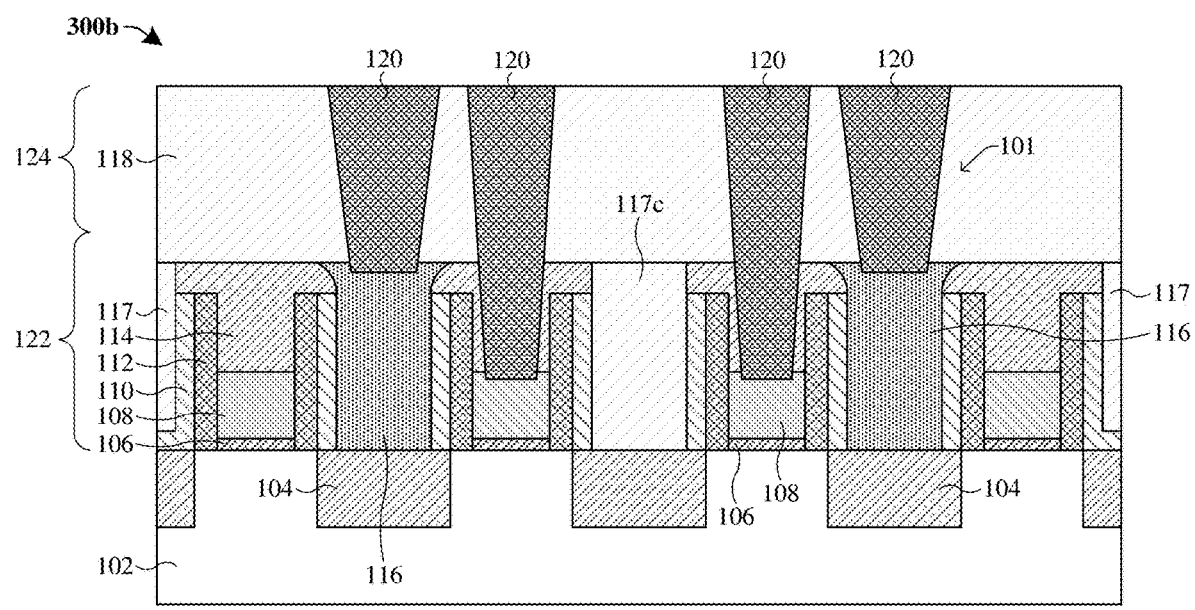

FIG. 3B illustrates a cross-sectional view of some embodiments of an integrated chip 300*b* corresponding to some alternative embodiments of the integrated chip 200*c* of FIG. 2C, in which upper corners of the gate capping layer 114 that are directly adjacent to a corresponding lower source/drain contact 116 are curved or rounded. In further embodiments, upper corners of the gate capping layer 114 that contact the lower ILD layer 117 are not curved or rounded and conform to a rectangular shape.

Figure 4:
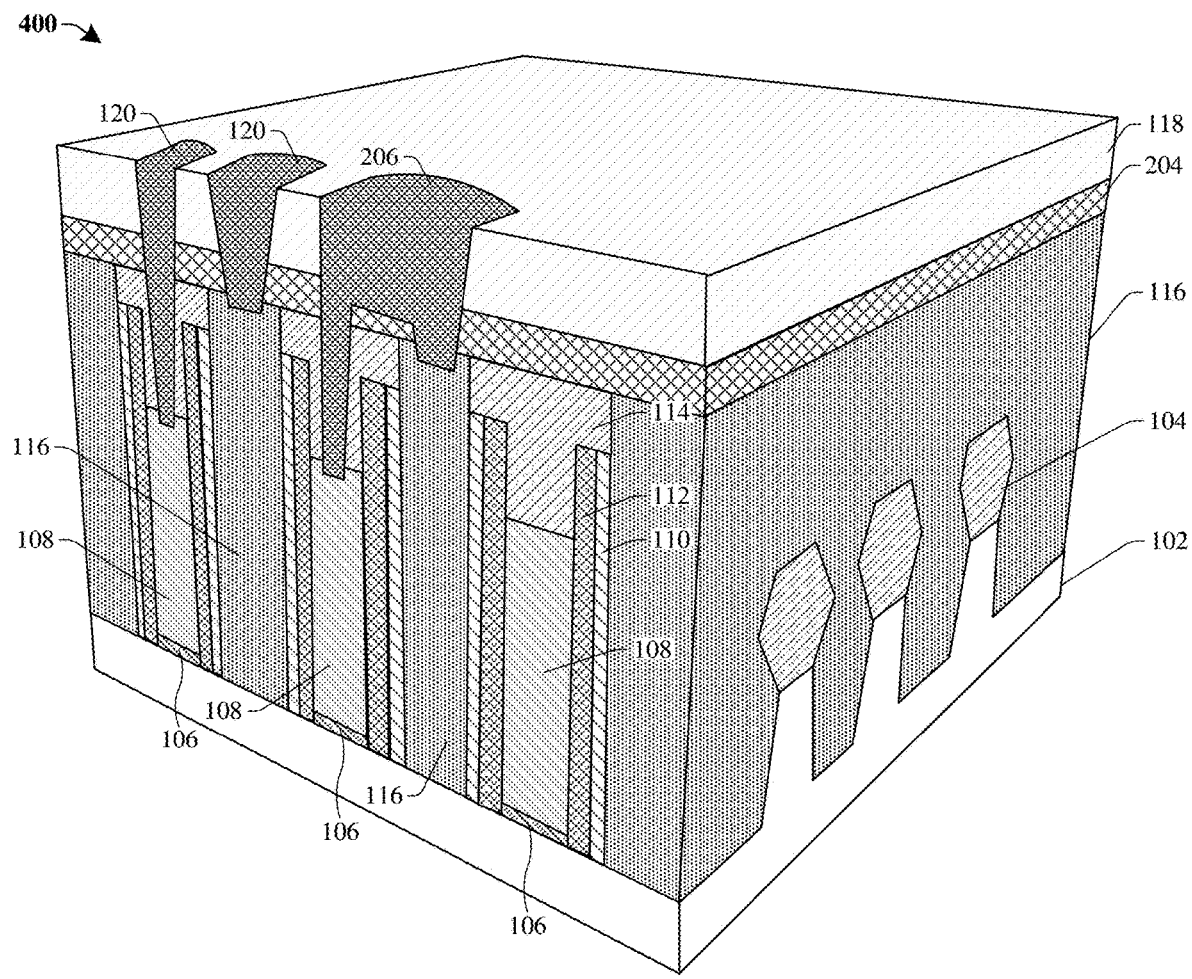
FIG. 4 illustrates a perspective view of some embodiments of an integrated chip having a gate capping layer over a gate electrode.

FIG. 4 illustrates a perspective view of an integrated chip 400 having a gate capping layer 114 overlying a gate electrode 108.

In some embodiments, the integrated chip 400 comprises FinFET devices, nanowire devices, or other gate-all-around (GAA) devices. The substrate 102 may comprise a lower base portion and a plurality of upper columns raised from the lower base portion, extended along a channel length direction, and arranged in parallel from one another. Epitaxial semiconductor layers may be disposed on the plurality of upper columns of the substrate 102 and may comprise high doped portions on opposite sides as the source/drain regions 104 and lightly doped or non-doped portions between the source/drain regions 104 as channel regions. A conductive layer may be disposed on the channel regions as the gate electrode 108 and separated from the channel regions by a gate dielectric (e.g., the gate dielectric layer 106) and configured to control current flow of the channel regions. The gate electrode 108 may extend along a channel width direction perpendicular to the channel length direction. The gate electrode 108 may extend to wrap around sidewalls of the channel regions. As discussed in the figures above, in some embodiments, the gate capping layer 114 is disposed on the gate electrode 108, where the lower source/drain contacts 116 are disposed along sidewalls of the gate capping layer 114. The gate capping layer 114 may have a top surface aligned or coplanar with that of the lower source/drain contacts 116. In further embodiments, the plurality of upper conductive contacts 120 extend through the upper ILD layer 118 and the upper etch stop layer 204 to contact an underlying lower source/drain contact 116 and/or an underlying gate electrode 108.

FIGS. 5-14 illustrate cross-sectional views 500-1400 of some embodiments of a method of forming an integrated chip having a gate capping layer over a gate electrode according to the present disclosure. Although the cross-sectional views 500-1400 shown in FIGS. 5-14 are described with reference to a method, it will be appreciated that the structures shown in FIGS. 5-14 are not limited to the method but rather may stand alone separate of the method. Although FIGS. 5-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
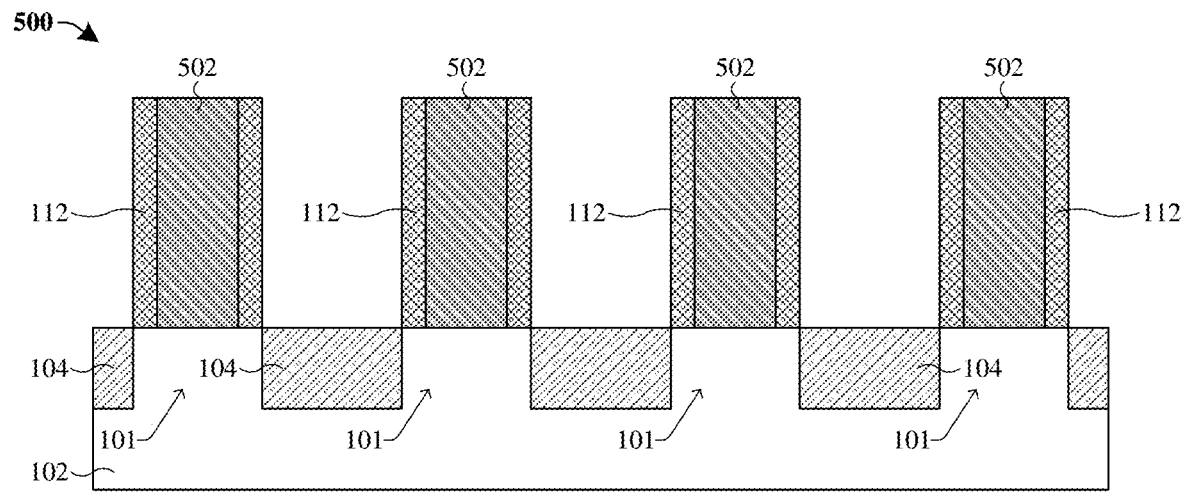
FIGS. 5-14 illustrate various cross-sectional views of some embodiments of a method of forming an integrated chip having a gate capping layer over a gate electrode.
Figure 6:
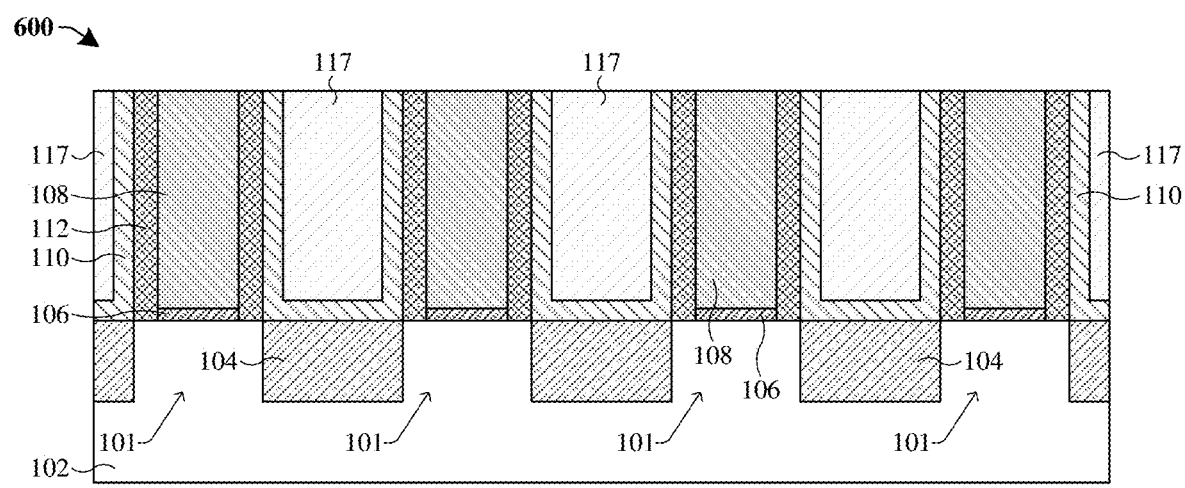

As shown in the cross-sectional views 500 and 600 of FIGS. 5 and 6, transistor structures 101 are prepared over a substrate 102 and surrounded by a lower ILD layer 117. The transistor structures 101 each have a gate dielectric layer 106 over the substrate 102, a gate electrode 108 over the gate dielectric layer 106, and a pair of source/drain regions 104 disposed within or on the substrate 102 on opposite sides of the gate electrode 108 (e.g., see FIG. 6). The gate electrode 108 may, for example, be or comprise polysilicon, aluminum, titanium, tungsten, another suitable conductive material, or any combination of the foregoing. Further, the gate dielectric layer 106 may, for example, be or comprise silicon dioxide, a high-k dielectric material, another suitable dielectric material, or any combination of the foregoing.

In some embodiments, each transistor structure 101 may be formed by a replacement gate process. For example, as shown in the cross-sectional view 500 of FIG. 5, dummy gate structures 502 are firstly formed and patterned over the substrate 102. Further, a sidewall spacer 112 is formed alongside the dummy gate structures 502 lining or covering sidewalls of the dummy gate structures 502. In various embodiments, the sidewall spacer 112 comprises silicon dioxide, silicon nitride, silicon carbide, aluminum oxide, aluminum nitride, another suitable dielectric material, or any combination of the foregoing. In some embodiments, the sidewall spacer 112 may comprise multiple layers, such as main spacer walls, liner layers, and the like. In further embodiments, a process for forming the sidewall spacer 112 may include: depositing (e.g., by chemical vapor deposition (CVD), physical vapor deposition (PVD), atomic layer deposition, etc.) a dielectric material over the dummy gate structures 502 and the substrate 102; and performing an etching process on the dielectric material such that a top surface of the sidewall spacer 112 is substantially aligned or coplanar with top surfaces of the dummy gate structures 502.

In various embodiments, the source/drain regions 104 may each be a doped region disposed within the substrate 102. In such embodiments, a process for forming the source/drain regions 104 may include performing an ion implantation process according to a masking layer (e.g., the dummy gate structures 502 and/or the sidewall spacer 112 may function as a masking layer during the ion implantation process) to implant dopants within the substrate 102, thereby forming the source/drain regions 104. In further embodiments, the source/drain regions 104 may each be or comprise an epitaxial semiconductor material disposed on and/or within the substrate 102. In such embodiments, the source/drain regions 104 may be formed by epitaxially growing silicon germanium or some other suitable semiconductor material over/on the substrate 102. For example, the source/drain regions 104 may be formed by molecular beam epitaxy (MBE), vapor phase epitaxy (VPE), liquid phase epitaxy (LPE), some other epitaxial process, or any combination of the foregoing. In some alternative embodiments, the source/drain regions 104 may be deposited rather than grown and the deposition may, for example, comprise a CVD process, a PVD process, and ALD process, or some other suitable deposition process. In some embodiments, the source/drain regions 104 may be doped (e.g., by an ion implantation process) such that the source/drain regions 104 comprise doped silicon germanium or some other suitable doped semiconductor material.

As shown in the cross-sectional view 500 of FIG. 5, a lower etch stop layer 110 is formed lining upper surfaces of the substrate 102 and extending upwardly along the sidewall spacer 112. Further, a dielectric layer is deposited (e.g., by CVD, PVD, ALD etc.) over the transistor structures 101 and the lower etch stop layer 110 followed by a planarization process (e.g., a chemical mechanical planarization (CMP)) to form the lower ILD layer 117. The lower etch stop layer 110 may be formed by a deposition process such as a CVD process, a PVD process, an ALD process, or another suitable growth or deposition process. Further, the lower ILD layer 117 may be deposited by a plasma enhanced CVD (PECVD) process, a PVD process, an ALD process, or another suitable growth or deposition process. The lower etch stop layer 110 and the lower ILD layer 117 may be planarized by a CMP process such that a top surface of the lower etch stop layer 110 is aligned or coplanar with a top surface of the lower ILD layer 117. In various embodiments, the lower ILD layer 117 may, for example, be or comprise silicon dioxide, doped silicon dioxide, oxygen-doped silicon carbide, silicon oxycarbide, a low-k dielectric material, another dielectric, or any combination of the foregoing. Further, the lower etch stop layer 110 may, for example, be or comprise a low-k dielectric material, silicon nitride, another dielectric material, or any combination of the foregoing.

In further embodiments, for the replacement gate process, the dummy gate structures 502 in FIG. 5 may be removed and replaced by the gate electrode 108 made of metal or another conductive material (e.g., polysilicon). Further, the gate dielectric layer 106 may also be formed after removing the dummy gate structures 502. To form the gate electrode 108, stacks of metal materials may be filled in gate openings followed by a planarization process to remove excessive portions above the lower ILD layer 117. In some embodiments, the stacks of metal materials may comprise or be made of titanium nitride, tantalum nitride, titanium aluminum, aluminum, tungsten, another suitable metal material, or any combination of the foregoing.

Figure 7:
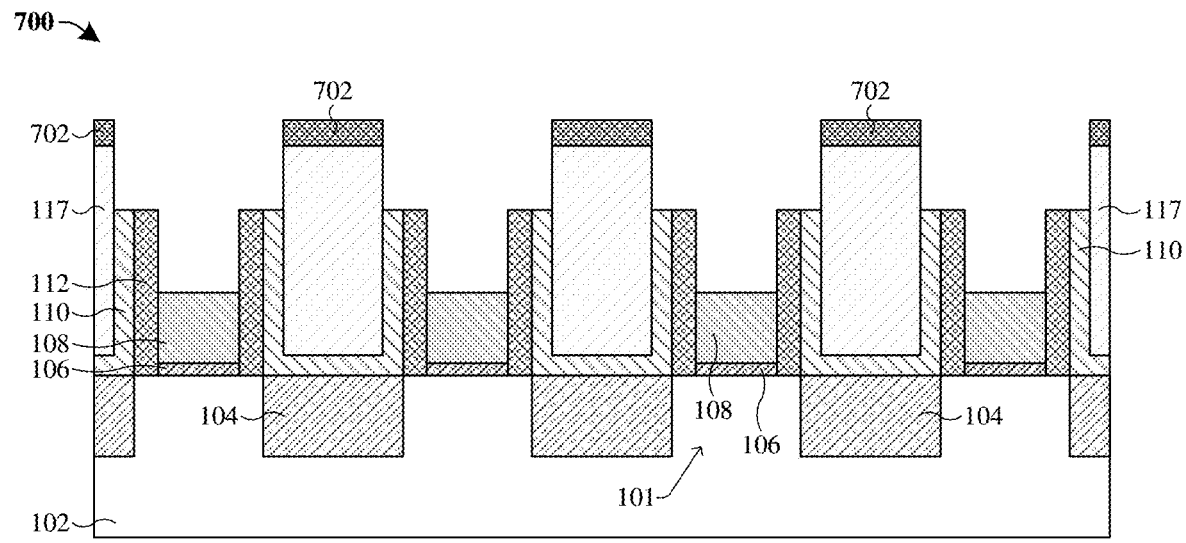

As shown in the cross-sectional view 700 of FIG. 7, the gate electrode 108 is patterned such that a top surface of the gate electrode 108 is recessed below the top surface of the lower ILD layer 117. In some embodiments, a process for patterning the gate electrode 108 includes: forming a masking layer 702 over the lower ILD layer 117, thereby leaving the gate electrode 108 exposed; and performing an etching process according to the masking layer 702 to lower the top surface of the gate electrode 108 to a position lower than the top surface of the lower ILD layer 117. In further embodiments, the etching process comprises an anisotropic etch such as a vertical dry etch, and the recessed top surface of the gate electrode 108 is substantially planar as shown in FIG. 7. In yet further embodiments, the etching process comprises an isotropic etch such as a wet etch, and the recessed top surface of the gate electrode 108 can have a concave shape (not shown). In various embodiments, a removal process is performed to remove the masking layer 702 (not shown).

Figure 8:
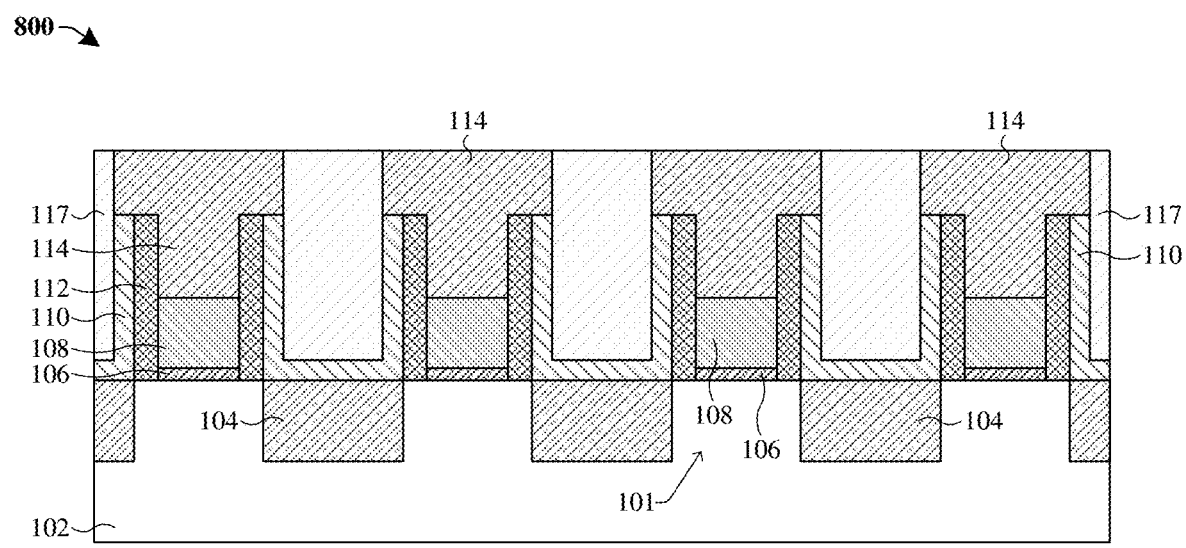

As shown in the cross-sectional view 800 of FIG. 8, a gate capping layer 114 is formed on the recessed gate electrode 108. In various embodiments, the gate capping layer 114 is configured to protect the gate electrode 108 during subsequent processing steps and may be referred to as a protection layer. In some embodiments, the gate capping layer 114 may be formed by a deposition process such as a CVD process, a PVD process, an ALD process, or another suitable growth or deposition process. In further embodiments, a planarization process (e.g., a CMP process) is performed on the gate capping layer 114 such that a top surface of the gate capping layer is aligned or coplanar with the top surface of the lower ILD layer 117. In various embodiments, the gate capping layer 114 may be or comprise silicon, silicon nitride, silicon carbon nitride, another suitable dielectric material, or any combination of the foregoing. In further embodiments, the gate capping layer 114 may be or comprise a non-oxide dielectric material.

Figure 9:
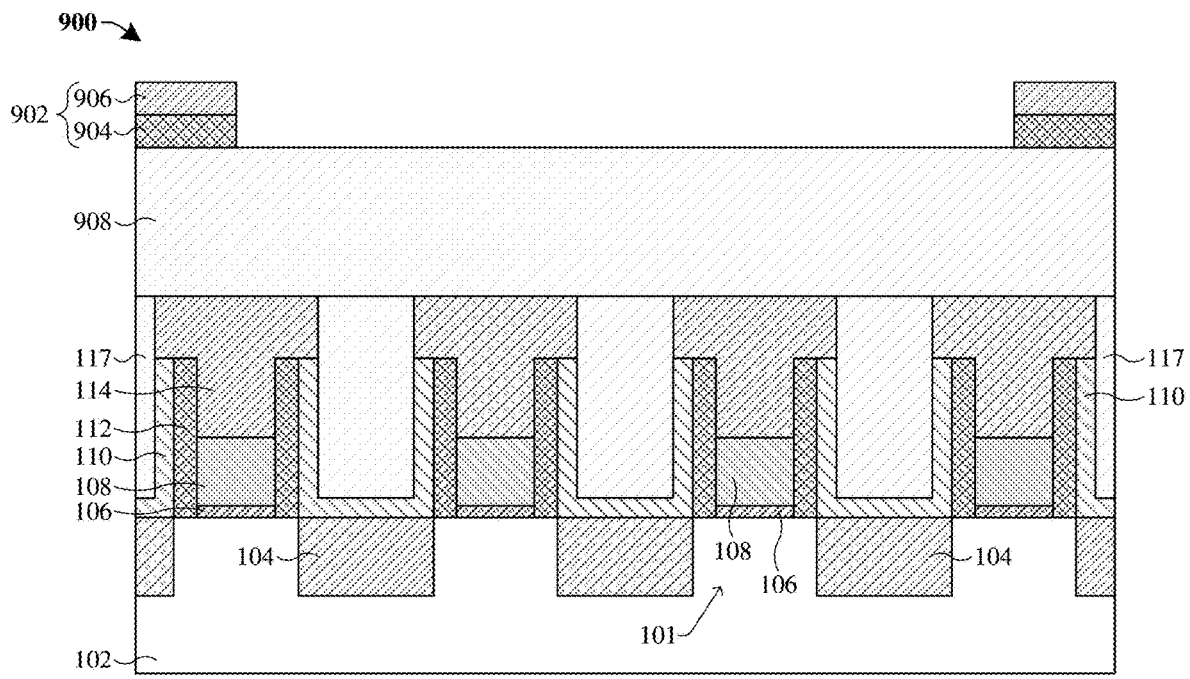

As shown in the cross-sectional view 900 of FIG. 9, an upper dielectric structure 908 is formed over the lower ILD layer 117 and the gate capping layer 114. In various embodiments, the upper dielectric structure 908 may be formed by depositing the upper dielectric structure 908 over the lower ILD layer 117 by a CVD process, a PVD process, an ALD process, or another suitable growth or deposition process. Further, after depositing the upper dielectric structure 908 over the lower ILD layer 117, a planarization process (e.g., a CMP process) may be performed on the upper dielectric structure 908 such that a top surface of the upper dielectric structure 908 is substantially flat. Further, a masking structure 902 is formed over the upper dielectric structure 908 where the masking structure 902 comprises a hard masking layer 904 disposed along the upper dielectric structure 908 and a dielectric layer 906 overlying the hard masking layer 904. In various embodiments, both the upper dielectric structure 908 and the lower ILD layer 117 comprise an oxide (e.g., silicon dioxide) different than a material of the gate capping layer 114. For example, the gate capping layer 114 comprises a non-oxide material.

Figure 10:
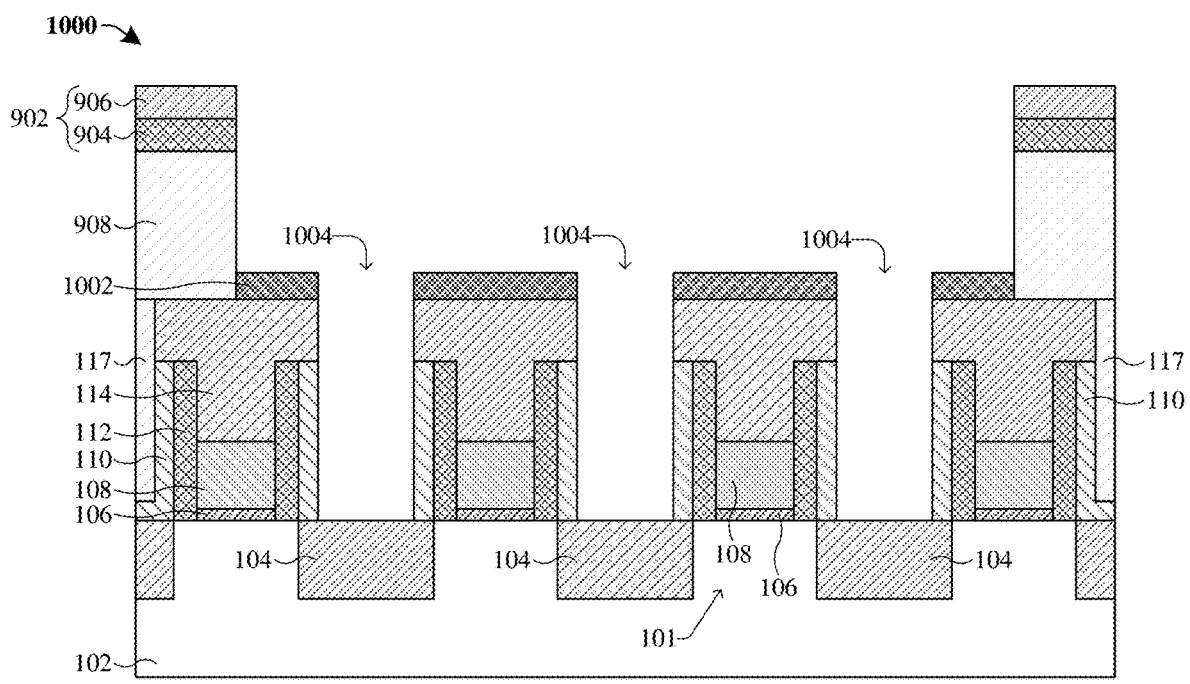

As shown in the cross-sectional view 1000 of FIG. 10, a selective etch and deposition process is performed on the upper dielectric structure 908, the gate capping layer 114, and the lower ILD layer 117, thereby forming source/drain contact openings 1004 over the source/drain regions 104 and selectively forming a dielectric protection layer 1002 along the top surface of the gate capping layer 114. In various embodiments, the selective etch and deposition process is configured to selectively form the dielectric protection layer 1002 along the gate capping layer 114 while concurrently etching the upper dielectric structure 908, the lower ILD layer 117, and/or the lower etch stop layer 110 to form the source/drain contact openings 1004. In various embodiments, the dielectric protection layer 1002 may, for example, be or comprise tungsten, boron nitride, molybdenum, another suitable material, or any combination of the foregoing. In further embodiments, the selective etch and deposition process may include performing a selective plasma etch process on the upper dielectric structure 908, the lower ILD layer 117, and/or the etch stop layer 110 while concurrently performing a selective CVD process to selectively form the dielectric protection layer 1002 along the upper surface of the gate capping layer 114.

In various embodiments, the selective etch and deposition process may be carried out in a processing chamber (not shown), where the substrate 102 is disposed within the processing chamber. In further embodiments, the selective etch and deposition process may include performing a selective etch process with a plasma etchant while concurrently performing a selective deposition process (e.g., a selective CVD process). For example, the selective etch and deposition process can be carried out by concurrently flowing the plasma etchant and a selective precursor gas within the processing chamber, where the plasma etchant is configured to selectively etch the lower ILD layer 117 and/or the etch stop layer 110 and the selective precursor gas is configured to selectively form the dielectric protection layer 1002 along the upper surface of the gate capping layer 114. In various embodiments, the plasma etchant may be formed as an inductively coupled plasma (ICP), a capacitively coupled plasma (CCP), an electron cyclotron resonance (ECR) plasma, or the like by a plasma source.

In some embodiments, the selective etch and deposition process is conducted within the processing chamber at a temperature of about 100° Celsius, in a range of between about 0° Celsius and 150° Celsius, or another suitable value, and at a pressure in a range of between about 1 millitorr and 1 torr, or another suitable value. In various embodiments, the plasma etchant is formed by the plasma source at a power in a range of about 300 watts and 1,200 watts, a range of about 50 watts and 2,000 watts, or another suitable value. In yet further embodiments, a bias voltage is applied to a wafer chuck (not shown) configured to hold the substrate 102 within the processing chamber. The bias voltage may, for example, be greater than 0 volts, in a range of between about 0 volts and 500 volts, or another suitable value. A carrier gas in the processing chamber may consist of hydrogen ($H_2$), nitrogen ($N_2$), and/or oxygen ($O_2$). In some embodiments, the selective etch and deposition process is carried out by concurrently flowing the plasma etchant and the selective precursor gas within the processing chamber. For example, the plasma etchant may be flowed into the processing chamber by a first gas line and the selective precursor gas may be flowed into the processing chamber by a second gas line that is separate from the first gas line. In some embodiments, by flowing the plasma etchant and the selective precursor gas into the processing chamber via separate gas lines, defect issues may be mitigated and/or prevented because the plasma etchant and the selective precursor gas do not interact with one another in a single gas line. In yet further embodiments, a flow rate of the plasma etchant into the processing chamber is greater than a flow rate of the selective precursor gas into the processing chamber. In some embodiments, the plasma etchant may be flowed into the processing chamber at a first flow rate between about 10 standard cubic centimeter per minute (sccm) and about 200 sccm, or another suitable value. In further embodiments, the selective precursor gas may be flowed into the processing chamber at a second flow rate between about 10 sccm and about 100 sccm, or another suitable value. In yet further embodiments, the carrier gas may be flowed into the processing chamber at a flow rate between about 100 sccm and about 1,000 sccm, or another suitable value.

In various embodiments, the plasma etchant may be or comprise fluorocarbon (e.g., $CF_4$), carbon hydrogen fluoride (e.g., $CHF_3$, $CH_2F_2$, $CH_3F$), sulfur hexafluoride (e.g., $SF_6$), chlorine (e.g., $C_{12}$), boron trichloride (e.g., $BCl_3$), hydrogen bromide (e.g., HBr), nitrogen trifluoride (e.g., $NF_3$), another suitable etchant, or any combination of the foregoing. In further embodiments, the selective precursor gas may be or comprise a metal fluoride (e.g., tungsten hexafluoride ($WF_6$)), boron chloride (e.g., $BCl_3$), dimethyl, trimethyl, another suitable precursor, or any combination. In various embodiments, the selective precursor gas is flowed into the processing chamber with the carrier gas (e.g., hydrogen ($H_2$) or nitrogen ($N_2$)). In an embodiment, if the selective precursor gas comprises tungsten hexafluoride (e.g., $WF_6$) then the carrier gas may consist essentially of hydrogen ($H_2$), and if the selective precursor gas comprises boron chloride (e.g., $BCl_3$) then the carrier gas may consist essentially of nitrogen ($N_2$). In some embodiments, by virtue of the selective precursor gas being flowed into the processing chamber, the dielectric protection layer 1002 is selectively formed along the upper surface of the gate capping layer 114 while not forming on the lower ILD layer 117. This, in part, occurs because the gate capping layer 114 comprises a non-oxide dielectric material while the lower ILD layer 117 comprises an oxide. Thus, the selective etch and deposition process is configured to selectively form the dielectric protection layer 1002 along a non-oxide dielectric material. Further, during the selective etch and deposition process, the dielectric protection layer 1002 is selectively formed along the gate capping layer 114 more quickly than it is removed and/or etched by the plasma etchant. Thus, the dielectric protection layer 1002 may act as a hard mask layer during the selective etch and deposition process that prevents or mitigates the gate capping layer 114 from being etched and/or damaged by the plasma etchant. This mitigates the formation of volatile by-products from the gate capping layer 114 and the plasma etchant, mitigates a reduction of a thickness of the gate capping layer 114, and mitigates the rounding of corners of the gate capping layer 114, thereby increasing a performance and structural integrity of the transistor structures 101.

In yet further embodiments, the lower etch stop layer 110 may be etched more quickly than the upper dielectric structure 908 and/or the lower ILD layer 117 during the selective etch and deposition process. In further embodiments, after forming the source/drain contact openings 1004, a removal process may be performed to selectively remove the dielectric protection layer 1002 from over the gate capping layer 114 (not shown). In various embodiments, the removal process may include performing a wet etch process and/or a dry etch process. For example, the removal process may include exposing the dielectric protection layer 1002 to deionized water, ammonia water, hydrogen peroxide, another suitable chemical, or any combination of the foregoing. In yet further embodiments, the removal process may further include exposing the dielectric protection layer 1002 to a fluorine-base etchant, or another suitable etchant.

Figure 11:
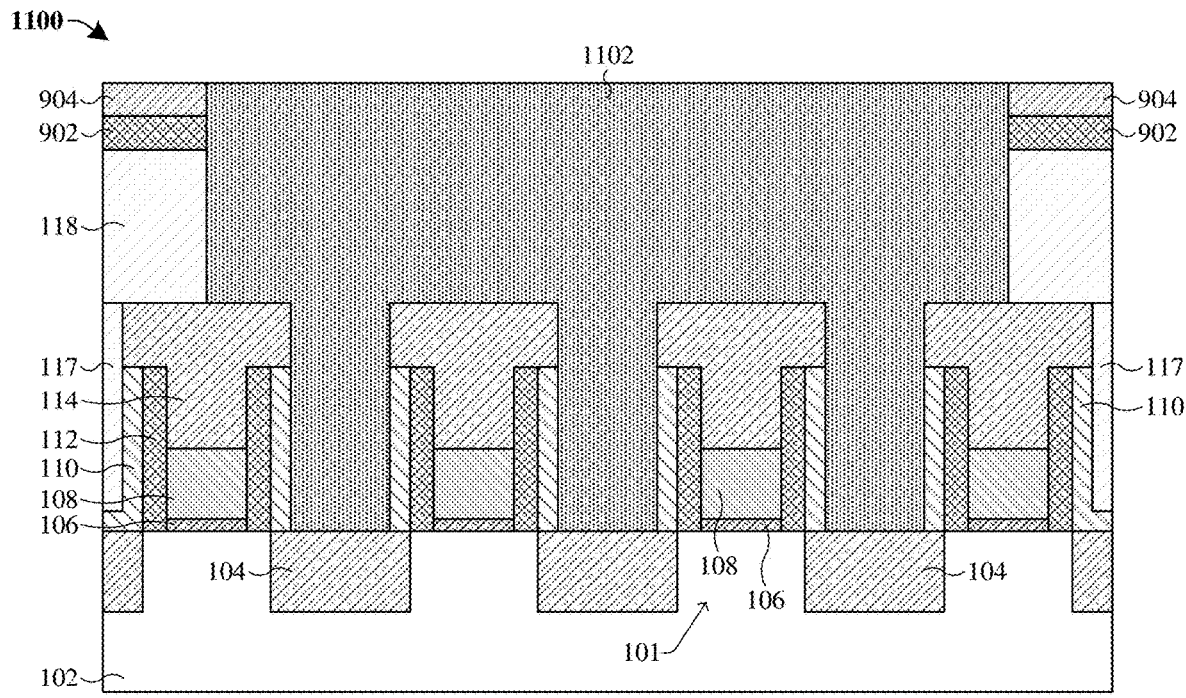

As shown in the cross-sectional view 1100 of FIG. 11, a conductive structure 1102 is formed within the source/drain contact openings (1004 of FIG. 10) and over the source/drain regions 104. In various embodiments, the conductive structure 1102 may, for example, be or comprise tungsten, copper, ruthenium, aluminum, molybdenum, tantalum, titanium, another conductive material, or any combination of the foregoing. In further embodiments, before forming the conductive structure 1102, a glue and/or barrier layer (not shown) may be formed over the substrate 102 that help to bond and/or prevent diffusion. In further embodiments, the conductive structure 1102 may be formed over the substrate 102 by depositing the conductive structure 1102 on the source/drain regions 104 and the gate capping layer 114 by a CVD process, a PVD process, a sputtering process, an electroplating process, or another suitable deposition or growth process. In further embodiments, a metallization process may be performed prior to forming the conductive structure 1102 to form a semiconductor-metal compound film or layer (such as silicide, germanides, germanosilicide, etc.) at an interface of the conductive structure 1102 and the exposed portion of the upper surface of the source/drain regions 104, thereby providing a low resistance contact (not shown).

Figure 12:
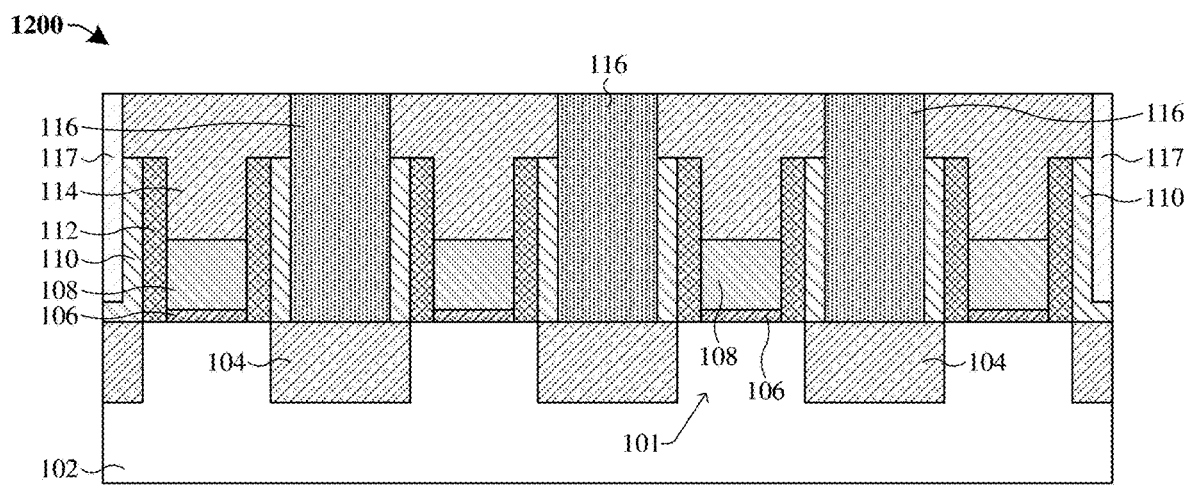

As shown in the cross-sectional view 1200 of FIG. 12, a planarization process is performed on the structure of FIG. 11, thereby defining a plurality of lower source/drain contacts 116. In various embodiments, forming the plurality of lower source/drain contacts 116 may include the acts illustrated and/or described in FIGS. 9-12. In some embodiments, the planarization process may include a CMP process, an etching process, another suitable planarization process, or any combination of the foregoing. In further embodiments, the planarization process is performed in such a manner that the top surface of the gate capping layer 114 is aligned or coplanar with top surfaces of the lower source/drain contacts 116.

Figure 13:
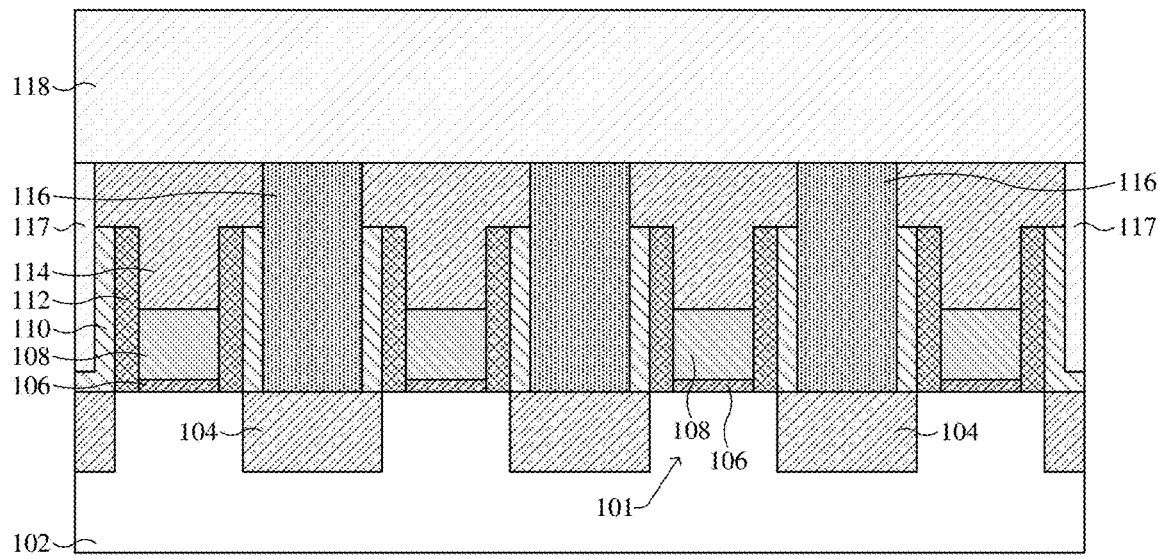

As shown in the cross-sectional view 1300 of FIG. 13, an upper ILD layer 118 is formed over the gate capping layer 114 and the plurality of lower source/drain contacts 116. In various embodiments, the upper ILD layer 118 may be or comprise tetraethylorthosilicate (TEOS) oxide, un-doped silicate glass, silicon dioxide, doped silicon dioxide such as borophosphosilicate glass (BPSG), fused silica glass (FSG), phosphosilicate glass (PSG), boron doped silicon glass (BSG), another suitable dielectric material, or any combination of the foregoing. In yet further embodiments, the upper ILD layer 118 may comprise a same material as the lower ILD layer 117. In some embodiments, the upper ILD layer 118 may be deposited by a CVD process, a PECVD process, a PVD process, an ALD process, or another suitable deposition or growth process.

Figure 14:
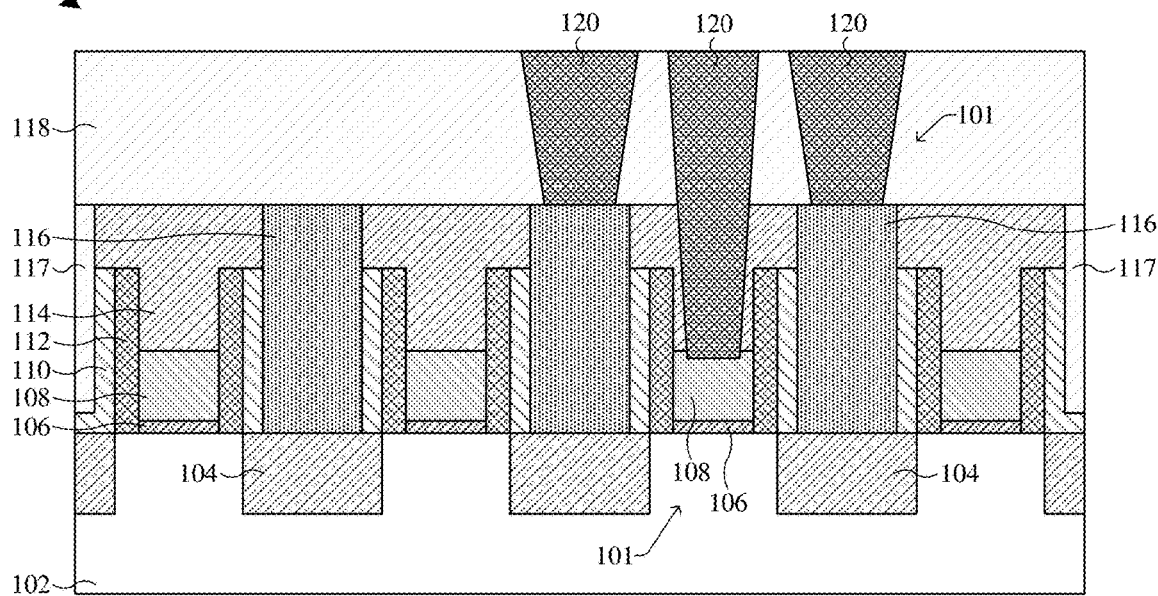

As shown in the cross-sectional view 1400 of FIG. 14, a plurality of upper conductive contacts 120 is formed within the upper ILD layer 118 and over the plurality of lower source/drain contacts 116. In various embodiments, a process for forming the plurality of upper conductive contacts 120 may include: forming a masking layer (not shown) over the upper ILD layer 118; patterning the upper ILD layer 118 and/or the gate capping layer 114 according to the masking layer to define a plurality of contact openings (not shown); depositing (e.g., by CVD, PVD, sputtering, electroplating, etc.) a conductive material (e.g., aluminum, copper, tungsten, ruthenium, titanium nitride, tantalum nitride, another conductive material, or any combination of the foregoing) over the substrate 102 and filling the plurality of contact openings; and performing a planarization process (e.g., a CMP process) into the conductive material until an upper surface of the upper ILD layer 118 is reached. In such embodiments, patterning the upper ILD layer 118 and/or the gate capping layer 114 may include performing a wet etch process, a dry etch process, another suitable etch process, or any combination of the foregoing. By performing the selective etch and deposition process of FIG. 10 to define the openings (1004 of FIG. 10) for the lower source/drain contacts 116, damage to the gate capping layer 114 is mitigated, thereby mitigating and/or preventing damage to the gate electrode 108 during formation of the upper conductive contacts 120 and/or during subsequent processing steps.

Figure 15:
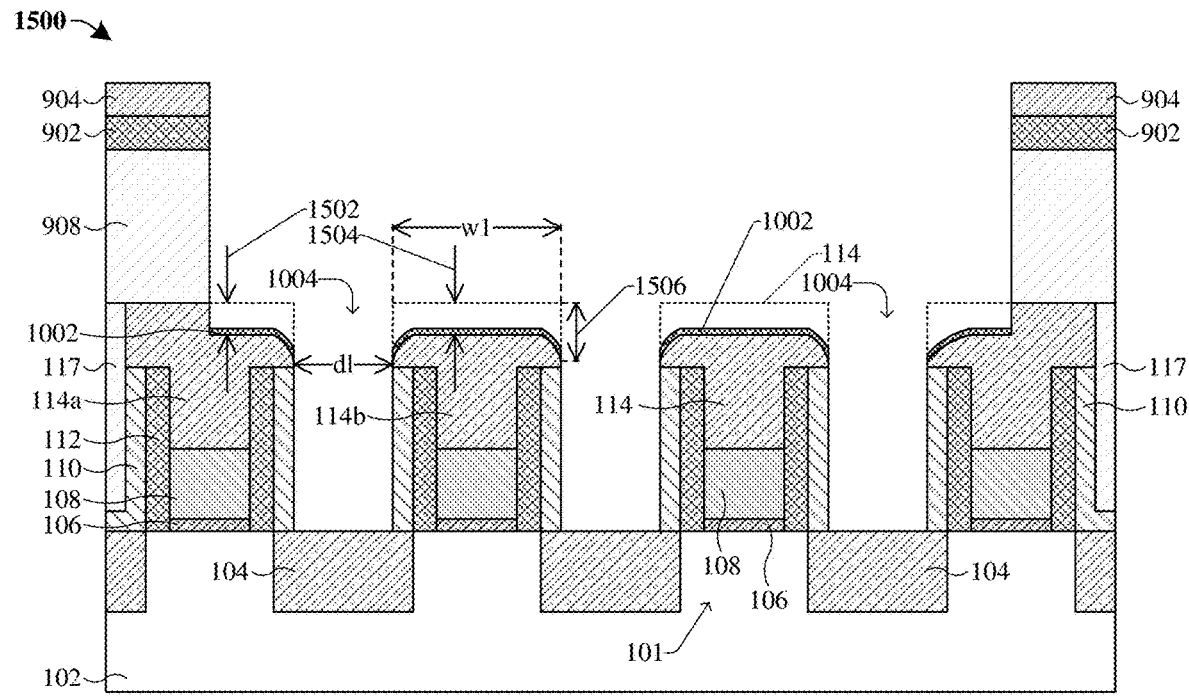
FIGS. 15-17 illustrate various cross-sectional views of some embodiments of a second method of forming an integrated chip having a gate capping layer over a gate electrode.
Figure 16:
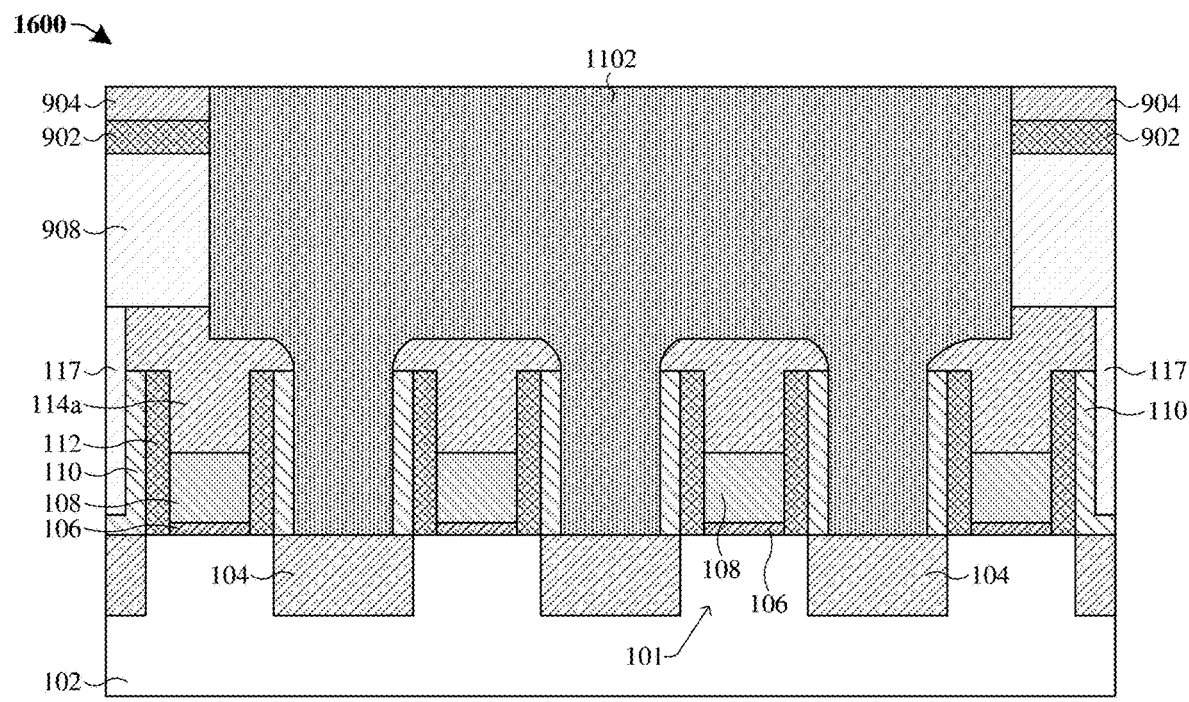
Figure 17:
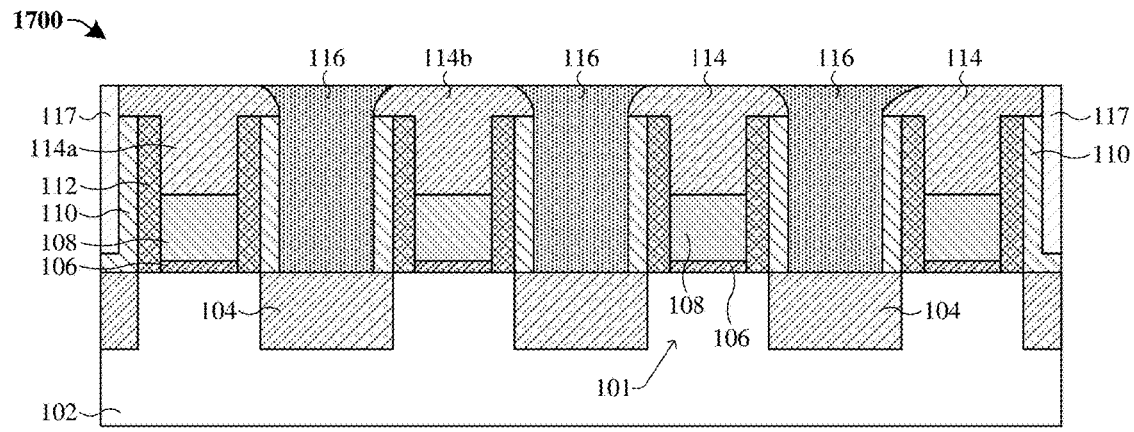

FIGS. 15-17 illustrate cross-sectional views 1500-1700 of some embodiments of a second method for forming an integrated chip having a gate capping layer over a gate electrode according to the present disclosure. For example, FIGS. 15-17 illustrate alternative embodiments of acts that may be performed in place of the acts at FIGS. 10-12 of the method of FIGS. 5-14. Thus, in some embodiments, the second method includes a method that alternatively proceeds from FIGS. 5-9 to FIGS. 15-17, and from FIG. 17 to FIGS. 13-14 (i.e., skipping FIGS. 10-12).

As shown in the cross-sectional view 1500 of FIG. 15, a selective etch and deposition process is performed on the upper dielectric structure 908, the gate capping layer 114, and the lower ILD layer 117, thereby forming source/drain contact openings 1004 over the source/drain regions 104 and selectively forming the dielectric protection layer 1002 along the top surface of the gate capping layer 114. In various embodiments, the selective etch and deposition process may be performed as described with reference to FIG. 10 above. However, in some embodiments, the selective etch and deposition process may reduce a thickness of the gate capping layer 114 and/or round the corners of the gate capping layer 114. This, in part, may occur because a first flow rate of the plasma etchant may be substantially greater than a second flow rate of the selective precursor gas during the selective etch and deposition process. For example, the first flow rate of the plasma etchant may be between about 30 sccm and about 50 sccm, and the second flow rate of the selective precursor gas may be about 20 sccm. For ease of illustration, an upper portion of the gate capping layer 114 is represented by a dashed-line, and in some embodiments, the upper portion of the gate capping layer 114 may be removed by the selective etch and deposition process. After the removal of the upper portion of the gate capping layer 114, the dielectric protection layer 1002 is selectively formed along the exposed upper surface of the gate capping layer 114 such that the dielectric protection layer 1002 conforms to the exposed upper surface of the gate capping layer 114.

In various embodiments, a first gate capping structure 114a of the gate capping layer 114 has its thickness reduced by a first vertical loss value 1502 of about 1 nanometer (nm), within a range of about 0.1 to 2 nm, less than about 2 nm, or another suitable value. In further embodiments, a second gate capping structure 114b of the gate capping layer 114 has its thickness reduced by a second vertical loss value 1504 of about 1 nm, within a range of about 0.1 to 2 nm, less than about 2 nm, or another suitable value. In some embodiments, the first vertical loss value 1502 is equal to the second vertical loss value 1504. In yet further embodiments, a width w1 of the second gate capping structure 114b of the gate capping layer 114 is about 45 nm, within a range of about 30 to 60 nm, or another suitable value. In various embodiments, a lateral distance d1 between adjacent structures of the gate capping layer 114 is about 15 nm, within a range of about 10 to 20 nm, or another suitable value. Further, a height of each outer corner of the exposed regions of the gate capping layer 114 may be reduced by a vertical distance 1506 during the selective etch and deposition process. In some embodiments, the vertical distance 1506 may be about 2.5 nm, within a range of about 0.1 to 5 nm, less than 5 nm, or another suitable value. In yet further embodiments, after performing the selective etch and deposition process, a removal process is performed to remove the dielectric protection layer 1002 from over the gate capping layer 114 (not shown).

As shown in the cross-sectional view 1600 of FIG. 16, a conductive structure 1102 is formed within the source/drain contact openings (1004 of FIG. 10) and over the source/drain regions 104. In some embodiments, before forming the conductive structure 1102, a glue and/or barrier layer (not shown) may be formed over the substrate 102 that help to bond and/or prevent diffusion. In further embodiments, the conductive structure 1102 may be formed over the substrate 102 by depositing the conductive structure 1102 on the source/drain regions 104 and the gate capping layer 114 by a CVD process, a PVD process, a sputtering process, an electroplating process, or another suitable deposition or growth process. In yet further embodiments, a metallization process may be performed prior to forming the conductive structure 1102 to form a semiconductor-metal compound film or layer (such as silicide) at an interface of the conductive structure 1102 and the exposed portion of the upper surface of the source/drain regions 104, thereby providing a low resistance contact (not shown). Further, the conductive structure 1102 is formed such that it conforms to the rounded corners of the gate capping layer 114.

As shown in the cross-sectional view 1700 of FIG. 17, a planarization process is performed on the structure of FIG. 16, thereby defining a plurality of lower source/drain contacts 116. In various embodiments, FIGS. 15-17 illustrate an alternative embodiment of forming the plurality of lower source/drain contacts 116. In some embodiments, the planarization process may include a CMP process, an etching process, another suitable planarization process, or any combination of the foregoing. In yet further embodiments, due to the conductive structure (1102 of FIG. 16) conforming to the rounded corners of the gate capping layer 114, at least a portion of each lower source/drain contact 116 comprise an outer protrusion that directly overlies and conforms to a shape of an adjacent segment of the gate capping layer 114.

FIGS. 18-22A illustrate cross-sectional views 1800-2200a of some embodiments of a third method for forming an integrated chip having a gate capping layer over a gate electrode according to the present disclosure. For example, FIGS. 18-22A illustrate alternative embodiments of acts that may be performed in place of the acts at FIGS. 9-14 of the method of FIGS. 5-14. Thus, in some embodiments, the third method includes a method that alternatively proceeds from FIGS. 5-8 to FIGS. 18-22A (i.e., skipping FIGS. 9-14).

Figure 18:
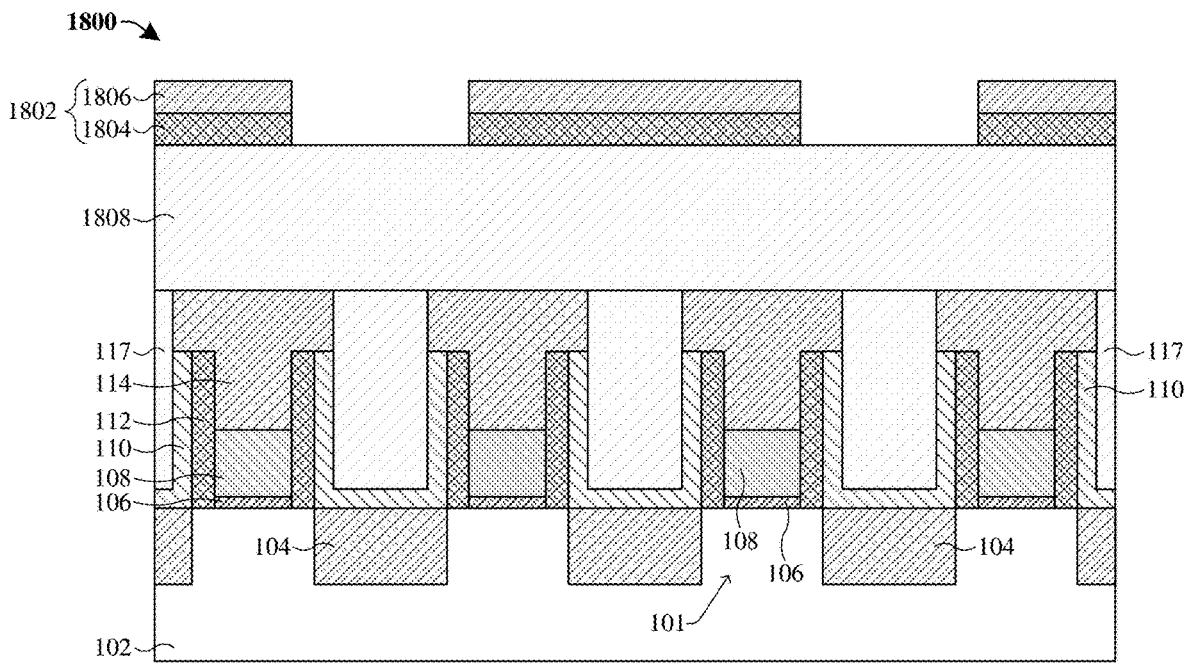
FIGS. 18-22B illustrate various cross-sectional views of some additional alternative embodiments of the second method.

As shown in the cross-sectional view 1800 of FIG. 18, an upper dielectric structure 1808 is formed over the lower ILD layer 117 and the gate capping layer 114. In various embodiments, the upper dielectric structure 1808 may be formed by depositing the upper dielectric structure 1808 over the lower ILD layer 117 by a CVD process, a PVD process, an ALD process, or another suitable growth or deposition process. Further, a masking structure 1802 is formed over the upper dielectric structure 1808 where the masking structure 1802 comprises a hard masking layer 1804 disposed along the upper dielectric structure 1808 and a dielectric layer 1806 overlying the hard masking layer 1804.

Figure 19:
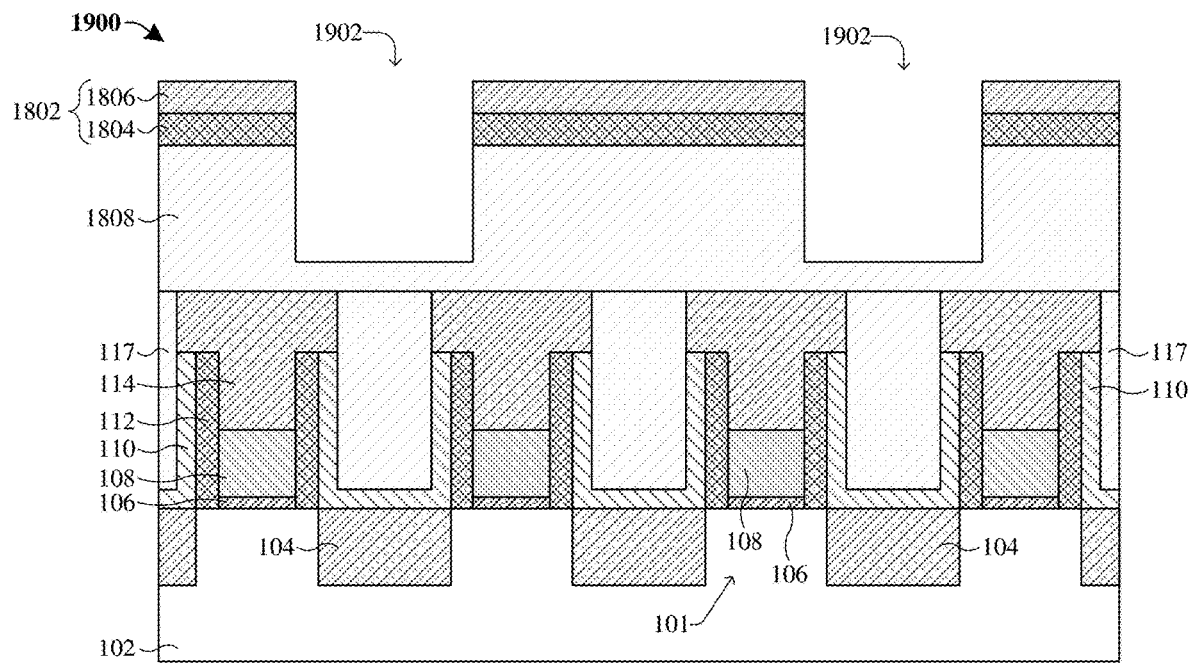

As shown in the cross-sectional view 1900 of FIG. 19, a patterning process is performed on the upper dielectric structure 1808 according to the masking structure 1802, thereby defining a plurality of openings 1902 within the upper dielectric structure 1808. In various embodiments, the patterning process includes performing a dry etch process, a wet etch process, another suitable etch process, or any combination of the foregoing.

Figure 20:
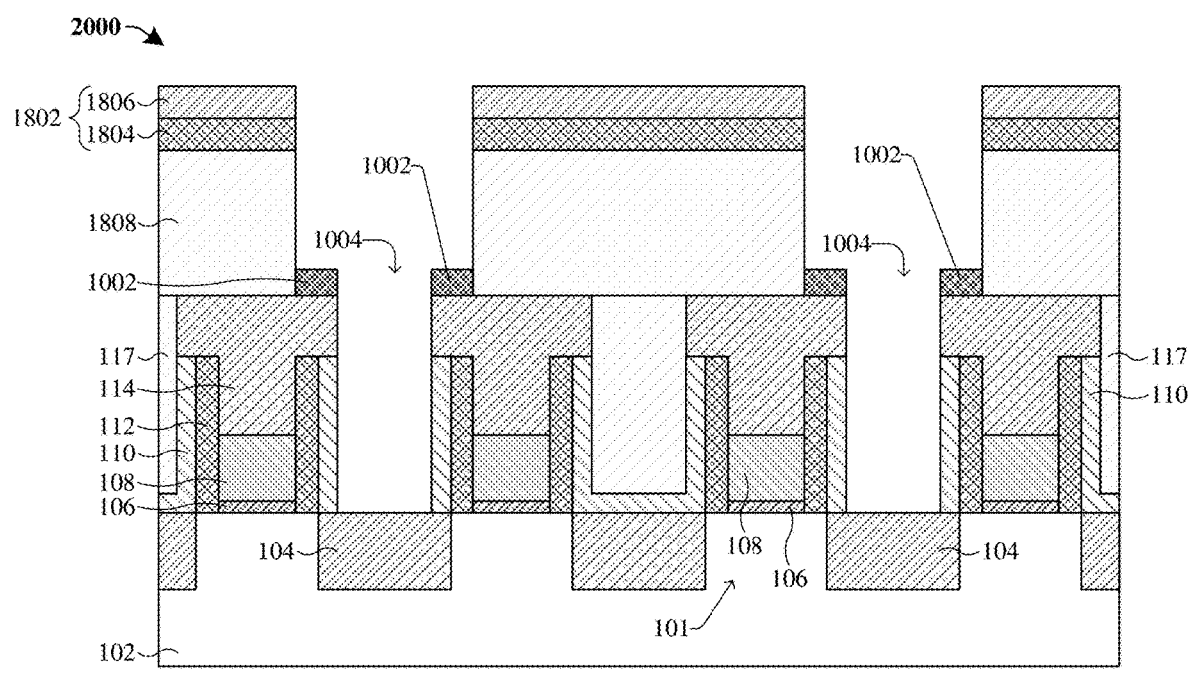

As shown in the cross-sectional view 2000 of FIG. 20, a selective etch and deposition process is performed on the upper dielectric structure 1808, the gate capping layer 114, and the lower ILD layer 117, thereby forming source/drain contact openings 1004 over the source/drain regions 104 and selectively forming a dielectric protection layer 1002 along the top surface of the gate capping layer 114. In various embodiments, the selective etch and deposition process is performed as illustrated and/or described in FIG. 10. In further embodiments, the selective etch and deposition process expands the openings (1902 of FIG. 19) while forming the source/drain contact openings 1004 and exposes a top surface of the source/drain regions 104. In various embodiments, after performing the selective etch and deposition process a removal process is performed to remove the dielectric protection layer 1002 from along the top surface of the gate capping layer 114 (not shown).

Figure 21:
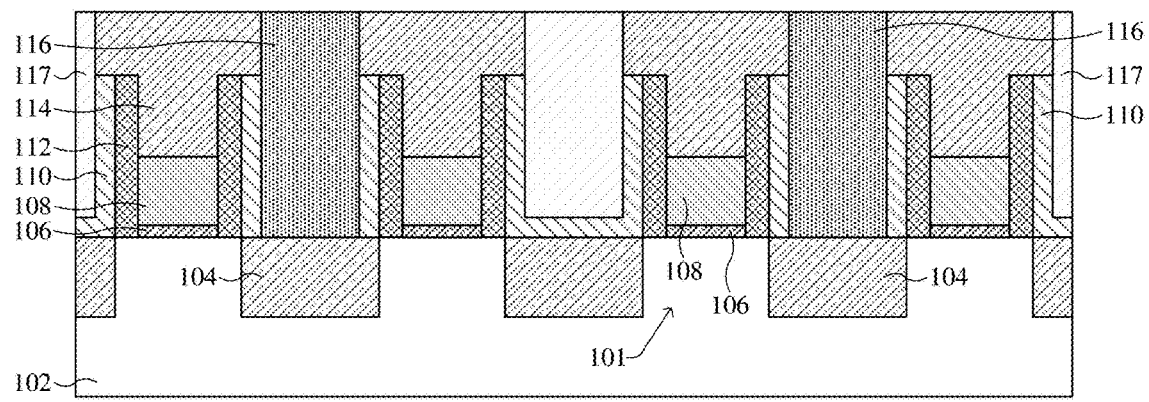

A shown in the cross-sectional view 2100 of FIG. 21, a plurality of lower source/drain contacts 116 is formed within the source/drain contact openings (1004 of FIG. 20) over corresponding source/drain regions 104. In various embodiments, a process for forming the plurality of lower source/drain contacts 116 includes: depositing (e.g., by a CVD process, a PVD process, a sputtering process, an electroplating process, etc.) a conductive structure (not shown) over the substrate 102 such that the conductive structure fills the source/drain contact openings (1004 of FIG. 20); and performing a planarization process (e.g., a CMP process) into the conductive structure until a top surface of the gate capping layer 114 is reached. In various embodiments, the lower source/drain contacts 116 are formed such that top surfaces of the lower source/drain contacts 116 are aligned or coplanar with the top surface of the gate capping layer 114 and/or the top surface of the lower ILD layer 117. In yet further embodiments, the planarization process may remove the upper dielectric structure (1808 of FIG. 20) and/or the masking structure (1802 of FIG. 20).

Figure 22A:
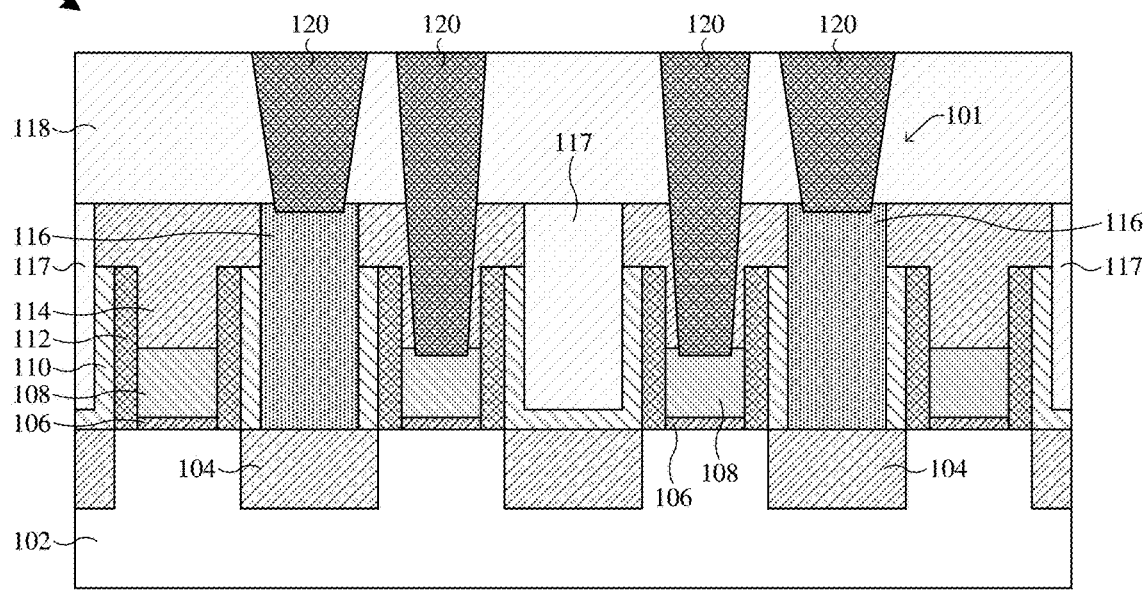

As shown in the cross-sectional view 2200a of FIG. 22A, an upper ILD layer 118 is formed over the lower ILD layer 117 and a plurality of upper conductive contacts 120 is formed within the upper ILD layer 118. In various embodiments, the upper ILD layer 118 may be formed as illustrated and/or described in FIG. 13. In further embodiments, the plurality of upper conductive contacts 120 may be formed as illustrated and/or described in FIG. 13.

Figure 22B:
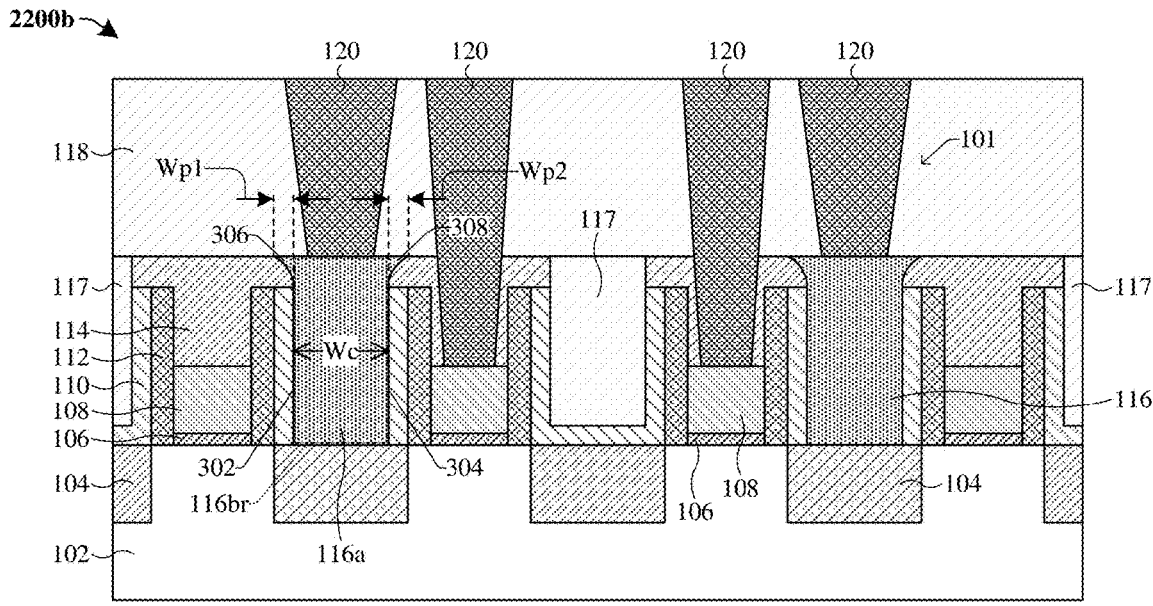

FIG. 22B illustrates a cross-sectional view 2200b of some alternative embodiments of the cross-sectional view 2200a of FIG. 22A, in which the plurality of lower source/drain contacts 116 is formed over corresponding source/drain regions 104 such that each lower source/drain 116 comprises one or more protrusions that conforms to an adjacent rounded corner of the gate capping layer 114. In such embodiments, the selective etch and deposition process utilized to from the source/drain contact openings (e.g., 1004 of FIG. 20) may be performed as illustrated and/or described in FIG. 15.

In various embodiments, the plurality of lower source/drain contacts 116 includes a first lower source/drain contact 116a. The first lower source/drain contact 116a has a first straight sidewall 302 and a second straight sidewall 304 opposite the first straight sidewall 302. In some embodiments, the first lower source/drain contact 116a comprises a body region 116br and one or more protrusions 306, 308 that extend from the body region 116br to an adjacent rounded corner of the gate capping layer 114. The body region 116br is defined between the first straight sidewall 302 and the second straight sidewall 304, such that a width Wc of the body region 116br is defined between the first and second straight sidewalls 302, 304. In various embodiments, the width Wc is about 15 n), within a range of about 10 to 20 nm, or another suitable value. In yet further embodiments, the first lower source/drain contact 116a comprises a first protrusion 306 that extends from the body region 116br in a first direction and a second protrusion 308 that extends from the body region 116br in a second direction that is opposite the first direction. A first width Wp1 of the first protrusion 306 is defined from the body region 116br to an outermost point of the first protrusion 306, and a second width Wp2 of the second protrusion 308 is defined from the body region 116br to an outermost point of the second protrusion 308. In various embodiments, the first and second widths Wp1, Wp2 are respectively about 0.75 nm, within a range of about 0.5 to 1 nm, less than about 1 nm, or another suitable value.

In some embodiments, a ratio between the first width Wp1 and the width Wc (e.g., Wp1:Wc) is, for example, about 1:20, within a range of about 0.25:20 to 1:20, or another suitable value. In further embodiments, a ratio between the second width Wp2 and the width Wc (e.g., Wp2:Wc) is, for example, about 1:20, within a range of about 0.25:20 to 1:20, or another suitable value. In various embodiments, if the ratios between the first and second width Wp1, Wp2 and the width Wc (e.g., Wp1:Wc and Wp2:Wc) are relatively low (e.g., less than about 1:20), then a distance between the lower source/drain contacts 116 and laterally adjacent upper conductive contacts 120 is increased. This, in part, reduces parasitic capacitance between the lower source/drain contacts 116 and the upper conductive contacts 120. In yet further embodiments, if the ratios between the first and second width Wp1, Wp2 and the width Wc are relatively high (e.g., greater than about 1:20), then a distance between the lower source/drain contacts 116 and laterally adjacent upper contacts 120 is decreased. This may increase parasitic capacitance between the lower source/drain contacts 116 and the upper conductive contacts 120.

Figure 23:
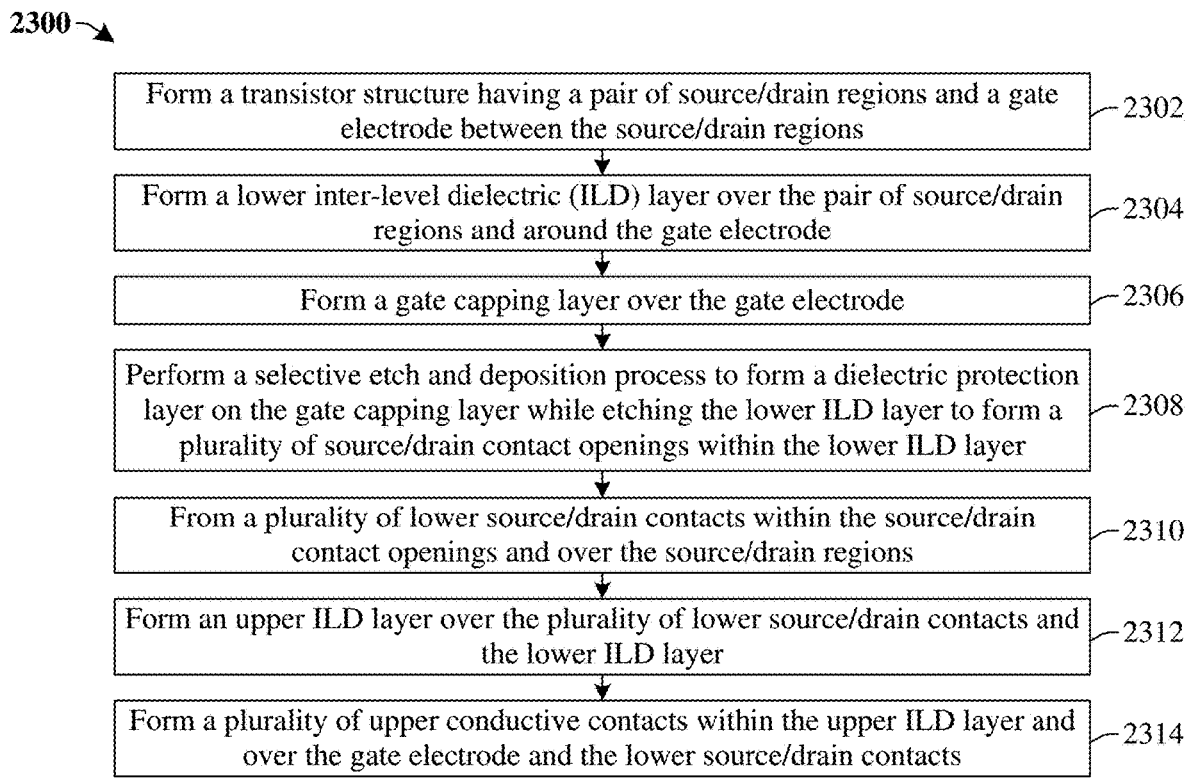
FIG. 23 illustrates a flow diagram of some embodiments of a method of forming an integrated chip having a gate capping layer over a gate electrode.

FIG. 23 illustrates a method 2300 of forming an integrated chip having a gate capping layer over a gate electrode according to the present disclosure. Although the method 2300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2302, a transistor structure is formed having a pair of source/drain regions and a gate electrode between the source/drain regions. FIGS. 5 and 6 illustrate cross-sectional views 500 and 600 corresponding to some embodiments of act 2302.

At act 2304, a lower inter-level dielectric (ILD) layer is formed over the pair of source/drain regions and around the gate electrode. FIG. 6 illustrates the cross-sectional view 600 corresponding to some embodiments of act 2304.

At act 2306, a gate capping layer is formed over the gate electrode. FIGS. 7 and 8 illustrate cross-sectional views 700 and 800 corresponding to some embodiments of act 2306.

At act 2308, a selective etch and deposition process is performed to form a dielectric protection layer on the gate capping layer while etching the lower ILD layer to form a plurality of source/drain contact openings within the lower ILD layer. FIG. 10 illustrates the cross-sectional view 1000 corresponding to some embodiments of act 2308. FIG. 15 illustrates the cross-sectional view 1500 corresponding to some alternative embodiments of act 2308. FIG. 20 illustrates the cross-sectional view 2000 corresponding to yet another alternative embodiment of act 2308.

At act 2310, a plurality of lower source/drain contacts is formed within the source/drain contact openings and over the source/drain regions. FIGS. 11 and 12 illustrate cross-sectional views 1100 and 1200 corresponding to some embodiments of act 2310. FIGS. 16 and 17 illustrate cross-sectional views 1600 and 1700 corresponding to some alternative embodiments of act 2310. FIG. 21 illustrates the cross-sectional view 2100 corresponding to yet another alternative embodiment of act 2310.

At act 2312, an upper ILD layer is formed over the plurality of lower source/drain contacts and the lower ILD layer. FIG. 13 illustrates the cross-sectional view 1300 corresponding to some embodiments of act 2312.

At act 2314, a plurality of upper conductive contacts is formed within the upper ILD layer and over the gate electrode and the lower source/drain contacts. FIG. 14 illustrates the cross-sectional view 1400 corresponding to some embodiments of act 2314. FIG. 22 illustrates the cross-sectional view 2200 corresponding to some alternative embodiments of act 2314.

Accordingly, in some embodiments, the present application relates to a method for forming an integrated chip (and a corresponding structure) that includes performing a selective etch and deposition process on a gate capping layer and a lower ILD layer to selectively form a dielectric protection layer on the gate capping layer while concurrently etching the lower ILD layer to form contact openings over corresponding source/drain regions. Subsequently, lower source/drain contacts are formed within the contact openings and over the source/drain regions.

In some embodiments, the present application provides a method for manufacturing an integrated chip, including: forming a transistor structure over a substrate, wherein the transistor structure comprises a pair of source/drain regions and a gate electrode between the source/drain regions; forming a lower inter-level dielectric (ILD) layer over the pair of source/drain regions and around the gate electrode; forming a gate capping layer over the gate electrode; and performing a selective etch and deposition process to form a dielectric protection layer on the gate capping layer while forming a contact opening within the lower ILD layer; and forming a lower source/drain contact within the contact opening.

In some embodiments, the present application provides a method for manufacturing an integrated chip, including: forming a transistor structure over a substrate, wherein the transistor structure comprises a pair of source/drain regions and a gate electrode between the source/drain regions; forming a lower etch stop layer and a lower inter-level dielectric (ILD) layer over the pair of source/drain regions and surrounding the gate electrode over the substrate, wherein the lower ILD layer comprises a first dielectric material; recessing the gate electrode such that a top surface of the gate electrode is below a top surface of the lower etch stop layer; forming a gate capping layer on the recessed gate electrode such that a top surface of the gate capping layer is aligned with a top surface of the lower ILD layer, wherein the gate capping layer comprises a second dielectric material different from the first dielectric material; performing a selective etch and deposition process to selectively form a dielectric protection layer along the top surface of the gate capping layer while concurrently selectively etching the lower ILD layer to define contact openings over the source/drain regions, wherein the selective etch and deposition process comprises concurrently flowing a plasma etchant at a first flow rate and a selective precursor gas at a second flow rate less than the first flow rate over the substrate; performing a removal process to remove the dielectric protection layer; and forming lower source/drain contacts within the contact openings.

In some embodiments, the present application provides an integrated chip, including a transistor structure disposed over a substrate and including a pair of source/drain regions and a gate electrode between the pair of source/drain regions; a lower inter-layer dielectric (ILD) layer disposed over the pair of source/drain regions and surrounding the gate electrode, wherein a top surface of the gate electrode is recessed from a top surface of the lower ILD layer, wherein the lower ILD layer comprises a first dielectric material; and a gate capping layer disposed on the gate electrode, wherein the gate capping layer has a top surface aligned with the top surface the lower ILD layer, wherein the gate capping layer comprises a second dielectric material different from the first dielectric material; and a lower source/drain contact disposed over a first source/drain region of the pair of source/drain regions, wherein a top surface of the lower source/drain contact is aligned with the top surface of the gate capping layer, wherein the lower source/drain contact comprises a body region and a first protrusion, wherein the first protrusion extends laterally from the body region to a point over a portion the gate capping layer, wherein a width of the body region is at least 20 times greater than a width of the first protrusion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated chip, comprising:
    forming a transistor structure over a substrate, wherein the transistor structure comprises a pair of source/drain regions and a gate electrode between the source/drain regions;
    forming a lower inter-level dielectric (ILD) layer over the pair of source/drain regions and around the gate electrode;
    forming a gate capping layer over the gate electrode; and
    performing a selective etch and deposition process to form a dielectric protection layer on the gate capping layer while forming a contact opening within the lower ILD layer; and
    forming a lower source/drain contact within the contact opening.

2. The method of claim 1, wherein the dielectric protection layer is formed on the gate capping layer while concurrently etching the lower ILD layer to form the contact opening.

3. The method of claim 1, wherein the selective etch and deposition process includes concurrently flowing a plasma etchant and a selective precursor gas over the gate capping layer and the lower ILD layer.

4. The method of claim 3, wherein the plasma etchant is different from the selective precursor gas.

5. The method of claim 3, wherein a flow rate of the plasma etchant is greater than a flow rate of the selective precursor gas.

6. The method of claim 1, wherein the selective etch and deposition process includes performing a selective etch process concurrently with a selective deposition process.

7. The method of claim 1, wherein the selective etch and deposition process is performed at a temperature in a range of between about 0° C. and 150° C.

8. The method of claim 1, wherein the gate capping layer comprises a first dielectric material and the lower ILD layer comprises a second dielectric material different from the first dielectric material.

9. The method of claim 8, wherein the first dielectric material is a non-oxide dielectric material and the second dielectric material is an oxide.

10. A method for manufacturing an integrated chip, comprising:
    forming a transistor structure over a substrate, wherein the transistor structure comprises a pair of source/drain regions and a gate electrode between the source/drain regions;
    forming a lower etch stop layer and a lower inter-level dielectric (ILD) layer over the pair of source/drain regions and surrounding the gate electrode over the substrate, wherein the lower ILD layer comprises a first dielectric material;
    recessing the gate electrode such that a top surface of the gate electrode is below a top surface of the lower etch stop layer;
    forming a gate capping layer on the recessed gate electrode such that a top surface of the gate capping layer is aligned with a top surface of the lower ILD layer, wherein the gate capping layer comprises a second dielectric material different from the first dielectric material;
    performing a selective etch and deposition process to selectively form a dielectric protection layer along the top surface of the gate capping layer while concurrently selectively etching the lower ILD layer to define contact openings over the source/drain regions, wherein the selective etch and deposition process comprises concurrently flowing a plasma etchant at a first flow rate and a selective precursor gas at a second flow rate less than the first flow rate over the substrate;
    performing a removal process to remove the dielectric protection layer; and
    forming lower source/drain contacts within the contact openings.

11. The method of claim 10, further comprising:
forming an upper ILD layer over the lower ILD layer and the lower source/drain contacts; and
forming upper conductive contacts within the upper ILD layer, where the upper conductive contacts are electrically coupled to the gate electrode and the lower source/drain contacts.

12. The method of claim 10, wherein the gate capping layer continuously extends from the top surface of the lower etch stop layer to the top surface of the gate electrode.

13. The method of claim 10, wherein the dielectric protection layer is selectively formed along the top surface of the gate capping layer more quickly than the dielectric protection layer is etched by the plasma etchant.

14. The method of claim 10, wherein the dielectric protection layer comprises a conductive material.

15. The method of claim 10, wherein the plasma etchant comprises a fluorine-based etchant and the selective precursor gas comprises a metal fluoride.

16. A method for manufacturing an integrated chip, comprising:
forming a transistor structure over a substrate, wherein the transistor structure comprises a pair of source/drain regions and a gate electrode between the source/drain regions;
forming a first dielectric layer over the pair of source/drain regions and around the gate electrode;
forming a gate capping layer over the gate electrode;
performing a selective etch and deposition process to form a dielectric protection layer on the gate capping layer while forming openings within the first dielectric layer over the pair of source/drain regions, wherein the selective etch and deposition process reduces a thickness of the gate capping layer;
forming a plurality of source/drain contacts within the openings; and
forming a plurality of conductive contacts over the gate electrode and the plurality of source/drain contacts.

17. The method of claim 16, wherein the gate capping layer comprises a curved corner after the selective etch and deposition process.

18. The method of claim 17, wherein the dielectric protection layer conforms to a shape of the curved corner of the gate capping layer.

19. The method of claim 16, wherein the dielectric protection layer continuously extends from an upper surface of the gate capping layer to a sidewall of the gate capping layer.

20. The method of claim 16, wherein forming the plurality of source/drain contacts includes:
depositing a conductive structure over the transistor structure and within the openings; and
performing a planarization process on the conductive structure, wherein the planarization process removes at least a portion of the gate capping layer.

* * * * *